(12) United States Patent
Simar, Jr. et al.

(10) Patent No.: US 11,171,651 B2
(45) Date of Patent: Nov. 9, 2021

(54) MIXED SIGNAL COMPUTER

(71) Applicant: Octavo Systems LLC, Sugar Land, TX (US)

(72) Inventors: Laurence Ray Simar, Jr., Richmond, TX (US); Erik James Welsh, Bellaire, TX (US); Peter Linder, Sugar Land, TX (US); Gene Alan Frantz, Sugar Land, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 0 days.

(21) Appl. No.: 16/975,090

(22) PCT Filed: Feb. 22, 2019

(86) PCT No.: PCT/US2019/019255
§ 371 (c)(1),
(2) Date: Aug. 21, 2020

(87) PCT Pub. No.: WO2019/165283
PCT Pub. Date: Aug. 29, 2019

(65) Prior Publication Data
US 2020/0403618 A1    Dec. 24, 2020

Related U.S. Application Data

(60) Provisional application No. 62/634,704, filed on Feb. 23, 2018.

(51) Int. Cl.
*H03M 1/12* (2006.01)
*H03K 19/17728* (2020.01)
*G06F 15/78* (2006.01)

(52) U.S. Cl.
CPC .... *H03K 19/17728* (2013.01); *G06F 15/7867* (2013.01); *H03M 1/1215* (2013.01); *H03M 1/1245* (2013.01)

(58) Field of Classification Search
CPC .......... H03K 19/17728; H03M 1/1215; H03M 1/1245
USPC ........................................................ 341/50
See application file for complete search history.

(56) References Cited

U.S. PATENT DOCUMENTS

| | | |
|---|---|---|
| 5,677,691 A | 10/1997 | Hosticka et al. |
| 5,784,636 A | 7/1998 | Rupp |
| 9,143,134 B1 | 9/2015 | Kutz et al. |
| 2009/0104880 A1* | 4/2009 | Abe .................. H04W 8/22 455/73 |

OTHER PUBLICATIONS

International Search Report and Written Opinion issued in Application No. PCT/US19/019255, dated Jun. 27, 2019, 12 pages.

* cited by examiner

*Primary Examiner* — Peguy Jean Pierre
(74) *Attorney, Agent, or Firm* — Rothwell, Figg, Ernst & Manbeck, P.C.

(57) ABSTRACT

The present disclosure describes a mixed signal computer unit using a combination of analog and digital components/elements in a cohesive manner. Depending on the signals and data that need to be processed, the analog processing elements and digital processing elements may be used separately, independently or in combination to optimize the computational results and the performance of the computation. Operations may be controlled by one or more digital cores.

18 Claims, 20 Drawing Sheets

FIG. 4B

```
main ()
{
    // Configure to implement an ODE on the
    // Reconfigurable Analog Array // This configuration will be for Network Control
    // Register Bank 0
4110    load_network_control_registers(bank = 0, pODE);
4120    load_coefficient_value_registers(bank = 0, pCOEF);
4130    wait_for_auxiliary_core_to_be_ready();
4140    start_array(bank = 0);
4150    wait_for_auxiliary_core_to_complete();
4160    stop_array(bank = 0);
} main ()
{
4210    *pInput = create_waveform('cos');    // Setup memory to contain digital waveform.

// Wait for the Master Core to finish setting up
        // the Reconfigurable Analog Array
4220    wait_for_master_core_to_be_ready();
4230    send_data_to_digital_input_registers(pInput);
4240    *pOutput = read_data_from_digital_output_registers();
4250    signal_done();
}
```

FIG. 7C

| Sample period | Accumulator 0 | Accumulator 1 | Accumulator 2 | Accumulator 3 | ACC Out | Output result |
|---|---|---|---|---|---|---|
| P1  | S1a0  | S1a1  | S1a2  | S1a3  | 0 | No output |
| P2  | S2a1  | S2a2  | S2a3  | S2a0  | 3 | No output |
| P3  | S3a2  | S3a3  | S3a0  | S3a1  | 2 | No output |
| P4  | S4a3  | S4a0  | S4a1  | S4a2  | 1 | S1a0 + S2a1 + S3a2 + S4a3 |
| P5  | S5a0  | S5a1  | S5a2  | S5a3  | 0 | S2a0 + S3a1 + S4a2 + S5a3 |
| P6  | S6a1  | S6a2  | S6a3  | S6a0  | 3 | S3a0 + S4a1 + S5a2 + S6a3 |
| P7  | S7a2  | S7a3  | S7a0  | S7a1  | 2 | S4a0 + S5a1 + S6a2 + S7a3 |
| P8  | S8a3  | S8a0  | S8a1  | S8a2  | 1 | S5a0 + S6a1 + S7a2 + S8a3 |
| P9  | S9a0  | S9a1  | S9a2  | S9a3  | 0 | S6a0 + S7a1 + S8a2 + S9a3 |
| P10 | S10a1 | S10a2 | S10a3 | S10a0 | 3 | S7a0 + S8a1 + S9a2 + S10a3 |
| P11 | S11a2 | S11a3 | S11a0 | S11a1 | 2 | S8a0 + S9a1 + S10a2 + S11a3 |
| P12 | S12a3 | S12a0 | S12a1 | S12a2 | 1 | S9a0 + S10a1 + S11a2 + S12a3 |
| ... | ... | ... | ... | ... | ... | ... |

| Time Slice | Sample period P1 | Sample period P2 | Sample period P3 | Sample period P4 | Sample period SP | Sample period P6 | Sample period P7 |
|---|---|---|---|---|---|---|---|
| 1 | ACC0 to zero | ACC3 to zero | ACC2 to zero | ACC1 to zero | ACC0 to zero | ACC3 to zero | ACC2 to zero |
| 2 | S1 X a0 | S2 X a0 | S3 X a0 | S4 X a0 | S5 X a0 | S6 X a0 | S7 X a0 |
| 3 | S1a0 to ACC0 | S2a0 to ACC3 | S3a0 to ACC2 | S4a0 to ACC1 | S5a0 to ACC0 | S6a0 to ACC3 | S7a0 to ACC2 |
| 4 | S1 X a1 | S2 X a1 | S3 X a1 | S4 X a1 | S5 X a1 | S6 X a1 | S7 X a1 |
| 5 | S1a1 to ACC1 | S2a1 to ACC0 | S3a1 to ACC3 | S4a1 to ACC2 | S5a1 to ACC1 | S6a1 to ACC0 | S7a1 to ACC3 |
| 6 | S1 X a2 | S2 X a2 | S3 X a2 | S4 X a2 | S5 X a2 | S6 X a2 | S7 X a2 |
| 7 | S1a2 to ACC2 | S2a2 to ACC1 | S3a2 to ACC0 | S4a2 to ACC3 | S5a2 to ACC2 | S6a2 to ACC1 | S7a2 to ACC0 |
| 8 | S1 X a3 | S2 X a3 | S3 X a3 | S4 X a3 | S5 X a3 | S6 X a3 | S7 X a3 |
| 9 | S1a3 to ACC3 | S2a3 to ACC2 | S3a3 to ACC1 | S4a3 to ACC0 | S5a3 to ACC3 | S6a3 to ACC2 | S7a3 to ACC1 |
| 10 | | | | ACC0 OUT | ACC3 OUT | ACC2 OUT | ACC1 OUT |

MIXED SIGNAL COMPUTER

CROSS REFERENCE TO RELATED APPLICATION(S)

This application is a 35 U.S.C. § 371 National Stage of International Patent Application No. PCT/US2019/019255, filed Feb. 22, 2019, designating the United States and claiming priority to U.S. Provisional Application No. 62/634,704, filed on Feb. 23, 2018. The above identified applications are incorporated by reference.

TECHNICAL FIELD

Aspects of the present disclosure relate to a computer for processing inputs using both analog and digital elements that work together or separately.

BACKGROUND

Often, today's world of real time computing is digital. But before the digital computer became the dominant method of computing, the analog computer was the primary way to handle real time signal processing. Analog computing elements and components have been used to take signals from the real world and process them in order to properly control various machines or for firing solutions computers for guided weapons.

The invention of the microprocessor in the early 1970s seemed to be the end of the analog computing era. The digital computer overcame multiple issues which plagued analog computing, such as noise, drift, and accuracy.

SUMMARY

According to some embodiments, a mixed signal computer architecture is described. The processor(s) of the computer may be mixed signal processors having one or more digital arrays of processing elements and components, and one or more analog arrays of processing elements and components. The arrays may be arranged with multiple operative communications and signaling paths between the arrays, and in some embodiments, the arrays are reconfigurable to perform different selected functions. In certain aspects, analog functionality may be dynamically programmed based on digital control.

According to some embodiments, a mixed signal computer is provided. It may include, for instance: an analog array containing a plurality of analog and digital components (and mixed signal components) for operatively connecting at least a portion of said analog components and said digital components in a configuration suitable for performing at least one selected analog processing function on an analog signal(s) supplied to said configuration, and a digital array containing a plurality of digital processing components, a first portion of which is used for configuring said network, and a second portion of which is used to determine the type of analog processing function to be performed.

According to some embodiments, a computer may also include a digital core control unit, one or more digital memories, and an analog memory. In certain aspects, the control unit may be configured to control the analog array and a plurality of registers. The analog array may operate based on instructions from the digital core control unit.

According to some embodiments a signal converter is provided, which comprises: a digital signal input; an analog signal input; a first plurality of signal outputs, wherein said first plurality of outputs are based on said digital input signal; and a second plurality of signal outputs, wherein said second plurality of outputs are based on said analog input signal, wherein said first plurality of outputs comprises a digital signal output, a sampled analog signal output, and a continuous analog signal output, and wherein said second plurality of outputs comprises a continuous analog signal output, a digital signal output, and a sampled analog signal output.

According to some embodiments, a mixed signal computer is provided, which comprises: a first exchange register; a second exchange register; and an operational block, wherein said first exchange register is coupled to the input of said operational block and said second exchange register is coupled to the output of said operational block, and wherein said operational block is configured to perform both analog and digital operations.

According to some embodiments, a mixed signal computer is provided that comprises at least one re-configurable analog processing array (RAPA); at least one programmable digital core array (PDCA); and one or more communication paths between said at least one RAPA and at least one PDCA.

In some embodiments, said at least one RAPA includes one or more additional components including: fan-out blocks; integrators; multipliers; memory, such as analog and digital memories; arithmetic units; adders; accumulators; digital to analog converters (DACs) and analog to digital converters (ADCs); analog inputs; analog outputs; banks of coefficient value registers; banks of threshold value registers; event timers registers; control registers; digital input registers; digital output registers; run control registers; and network or crossbar control registers organized into banks, and wherein at least two of said additional components of each of said at least one RAPA are connected via a programmable network.

In some embodiments, said programmable network comprises one or more crossbar networks. In some embodiments, said programmable network comprises a memory-mapped bus. In some embodiments, said communication paths comprise one or more address lines, data lines, and control lines.

In some embodiments, a plurality of said registers of said RAPA are addressable and memory mapped, and wherein said mixed signal computer is configured such that each of said plurality of registers may be read from or written to by one or more digital cores of said PDCA.

In some embodiments, said PDCA comprises one or more of a master core and an auxiliary core. In some embodiments, said master core is arranged to configure one or more analog components or network connections of said RAPA based on instructions stored in a digital memory, and wherein said master core is arranged to move one or more values from a PDCA memory into registers of said RAPA.

According to some embodiments, a method for processing mixed signals is provided. The process comprises generating data in a programmable digital core array (PDCA); transmitting said data to a re-configurable analog processing array (RAPA); and processing said data in said RAPA according to a selected function, wherein at least one core of said PDCA is arranged to configure said RAPA to perform said selected function.

In some embodiments, the process further comprises obtaining a plurality of sequential samples of an analog signal at a periodic rate, such that there is a time period between each of said plurality of samples; processing a first of said plurality of sequential samples in the analog domain to generate an output; and performing a digital operation on a digital sample, wherein processing of said first sample is completed before a second sample of said plurality of sequential samples is obtained.

In some embodiments, process further comprises performing operations on said data using analog and digital components; and controlling said analog and digital components with a programmed digital core.

According to some embodiments, a mixed signal computer is provided, which comprises an analog array containing one or more analog components and one or more digital components, wherein said at least a portion of said analog components and said digital components are connected in a network arranged to perform at least one selected analog processing function on an analog signal supplied to said analog array; and a digital array containing a plurality of digital processing units, wherein a first portion of said digital array is used for configuring said network, and wherein a second portion of said digital array is used to determine a type of said analog processing function to be performed by said analog array.

According to some embodiments, a mixed signal computer is provided, which comprises at least one digital core; at least one digital register connectable to at least one of said digital cores; one or more analog arrays containing configurable analog and digital components; one or more registers connected an analog-to-digital converter and a digital-to-analog converter; at least one analog register connect to at least one of said analog components; and one or more registers interconnected with at least one of said digital cores and at least one of said analog arrays.

According to some embodiments, a mixed signal computer is provide that comprises a re-configurable analog array comprising a plurality of analog components and a first plurality of digital components, wherein at least a portion of said plurality of analog components and said first plurality of digital components are configurable to form a connected network arranged to perform at least one selected analog processing function on an analog signal supplied to said re-configurable analog array; and a re-configurable digital array comprising a second plurality of digital processing units, wherein a first portion of said re-configurable digital array is used for configuring said connected network, and wherein a second portion of said re-configurable digital array is used to determine what type of said analog processing function is selected to be performed by said re-configurable analog array when formed in said connected network.

In some embodiments, said re-configurable digital array comprises at least one digital processing core and at least one digital register connectable to at least one of said digital processing cores, and wherein said re-configurable analog array comprises: one or more registers connected to one or more exchange registers, at least one analog register connected to at least one of said analog components, and one or more registers interconnected with at least one of said at least one digital processing cores and at least one of said components of said analog array.

In some embodiments, the mixed signal computer further comprises: one or more digital memories; one or more analog memories; and associated data, address, control buses, and memory controller blocks.

In some embodiments, at least one of said digital processing cores is a digital core control unit. In some embodiments, said digital core control unit is operable to configure the re-configurable analog array and a plurality of said digital registers in said re-configurable analog array, wherein said digital core control unit controls said configuration of said analog network array based on instructions stored in one of a plurality of associated digital memories of said re-configurable digital array, wherein said instructions for said digital core control unit load a plurality of registers to control said configuration of said re-configurable analog array, wherein said registers are configured to perform one of the following activities: controlling and defining the network array configuration and functionality; storing digital and analog values; storing coefficient values; storing threshold values; storing control signal values; storing event timer circuity values; and storing interconnections between components and elements, and wherein at least a portion of said registers are memory-mapped in said associated digital memories.

In some embodiments, each of said one or more exchange registers comprises: a digital signal input; an analog signal input; a first plurality of signal outputs, wherein said first plurality of outputs are based on said digital input signal; and a second plurality of signal outputs, wherein said second plurality of outputs are based on said analog input signal, wherein said first plurality of outputs comprises a digital signal output, a sampled analog signal output, and a continuous analog signal output, and wherein said second plurality of outputs comprises a continuous analog signal output, a digital signal output, and a sampled analog signal output.

In some embodiments, each of said one or more exchange registers is configured to output at least one of said first plurality of output signals in a floating point format and/or a fixed point format, and wherein said converter is configured to output at least one of said second plurality of output signals in a floating point format and/or a fixed point format.

In some embodiments, each of said one or more exchange registers is configured to accept an exponent and sign input as part of an analog signal input, and wherein said converter is configured to output at least one of said first and second plurality of output signals in floating point format based on said exponent and sign input, and wherein said output floating point format further comprises an analog mantissa.

In some embodiments, each of said one or more exchange registers, further comprises: a digital to analog converter and a smoothing filter, wherein said first plurality of output signals are generated, at least in part, by processing said digital input signal using said digital to analog converter and said smoothing filter; and a sample and hold unit and an analog to digital converter, wherein said second plurality of output signals are generated, at least in part, by processing said analogy input signal using said sample and hold unit and said analog to digital converter.

In some embodiments, said one or more digital memories comprise volatile and non-volatile memory.

In some embodiments, said re-configurable digital array, further comprises: at least one auxiliary core arranged to generate digital value waveforms and provide said waveforms to one or more digital input registers, and wherein said auxiliary core is arranged to preload values in one or more control registers from a memory in said digital array.

Aspects of the present disclosure may take advantage of new opportunities in imaging, Internet of Things ("IoT") and cloud computing, which have stretched the digital computer technology to its limits. For instance, the present disclosure describes a mixed signal computer containing a combination of analog and digital components/elements and using both in a cohesive and coordinated manner. Depending on the signals and data, the analog processing elements and digital processing elements may be used separately (stand-alone), independently (in parallel) or in combination to optimize the computational results and the performance of the computer.

For example, finding the minimum of a function could be broken into two stages. In the first stage an analog circuit quickly converges on an approximate solution. Then the digital processing elements take the resulting approximate solution and improve it to a higher level of precision. Thus, using mixed signal processing one does not need to choose between digital and analog computing but can take advantage of the best features of both.

These and other features of the disclosure will become apparent to those skilled in the art from the following detailed description of the disclosure, taken together with the accompanying drawings.

BRIEF DESCRIPTION OF THE DRAWINGS

FIGS. 4A and 4B illustrate processes according to some embodiments.

FIGS. 7A-7D depict aspects of an FIR filter example implementation by some embodiments.

DETAILED DESCRIPTION

Figure 1:
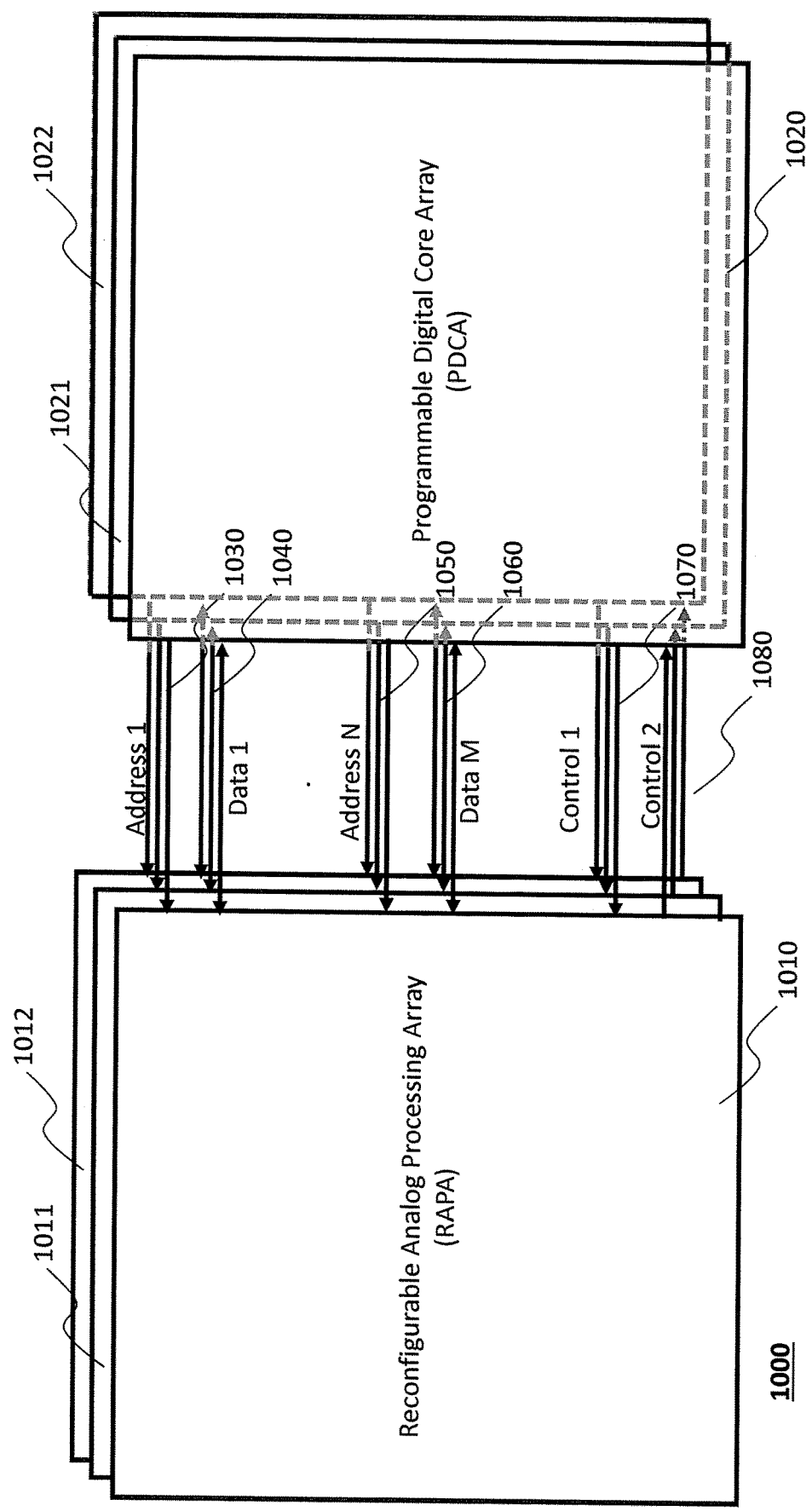
FIG. 1 depicts a block diagram of a mixed signal computer according to some embodiments.

Referring now to FIG. 1, a Mixed Signal Computer (MSC) 1000 according to some embodiments is provided. In this example, the MSC 1000 comprises two main blocks: a reconfigurable analog processing array (RAPA) 1010 and a Programmable Digital Core Array (PDCA) 1020, where one or more of the "cores" may be a programmable processor. As illustrated in FIG. 1, a set of N address buses 1030, 1050 and M data buses, 1040, 1060, may connect the RAPA 1010 and the PDCA 1020. The multiple data buses provide a way for digital data (and analog data, e.g., after conversion to a digital format) to move between the RAPA 1010 and the one or more digital cores in the PDCA 1020. The multiple address buses provide for addresses to be sent from one of the digital cores in the PDCA 1020 to the RAPA 1010. In some embodiments, the addresses make it possible for a digital core in PDCA 1020 to select one of a plurality of addressable registers, such as memory-mapped registers, in the RAPA 1010. This allows a digital core in PDCA 1020 to read from and write to the memory-mapped registers found in the RAPA. Alternatively, these memory-mapped registers may be found in the PDCA 1020, or alternatively partially in both arrays 1010, 1020.

As further illustrated in FIG. 1, a plurality of L control signals, represented as two sets of lines for ease of depiction purposes, 1070, 1080 connect the two arrays 1010, 1020. Each line may represent a plurality of such control signals. The control signals allow a number of signals such as for example, but not limited to, status indicators, protection bits, configuration status, to flow both from the RAPA 1010 to the PDCA 1020 and from the PDCA 1020 to the RAPA 1010. In some embodiments, the two arrays 1010 and 1020 may be fabricated to be on the same integrated circuit, or alternatively, on separate integrated circuits to take advantage of unique semiconductor processing optimizations for analog and digital components. According to some embodiments, analog elements may be built on optimized analog devices and digital elements may be built on optimized digital devices. However, in some embodiments, both digital and analog elements may be built on either analog or digital devices.

In some embodiments, there may be multiple RAPA 1010 and PDCA arrays 1020 linked together to form the MSC 1000. For such embodiments, the MSC 1000 may include combinations of one PDCA 1020 with two or more RAPAs 1010, 1011, 1012, etc. In other instances, the MSC 1000 may include two or more PDCAs 1020, 1021, 1022 with one RAPA 1010. In yet another instance, the MSC 1000 may include two or more PDCAs 1020, 1021, 1022, etc. and multiple RAPAs 1010, 1011, 1012, etc.

Figure 2A:
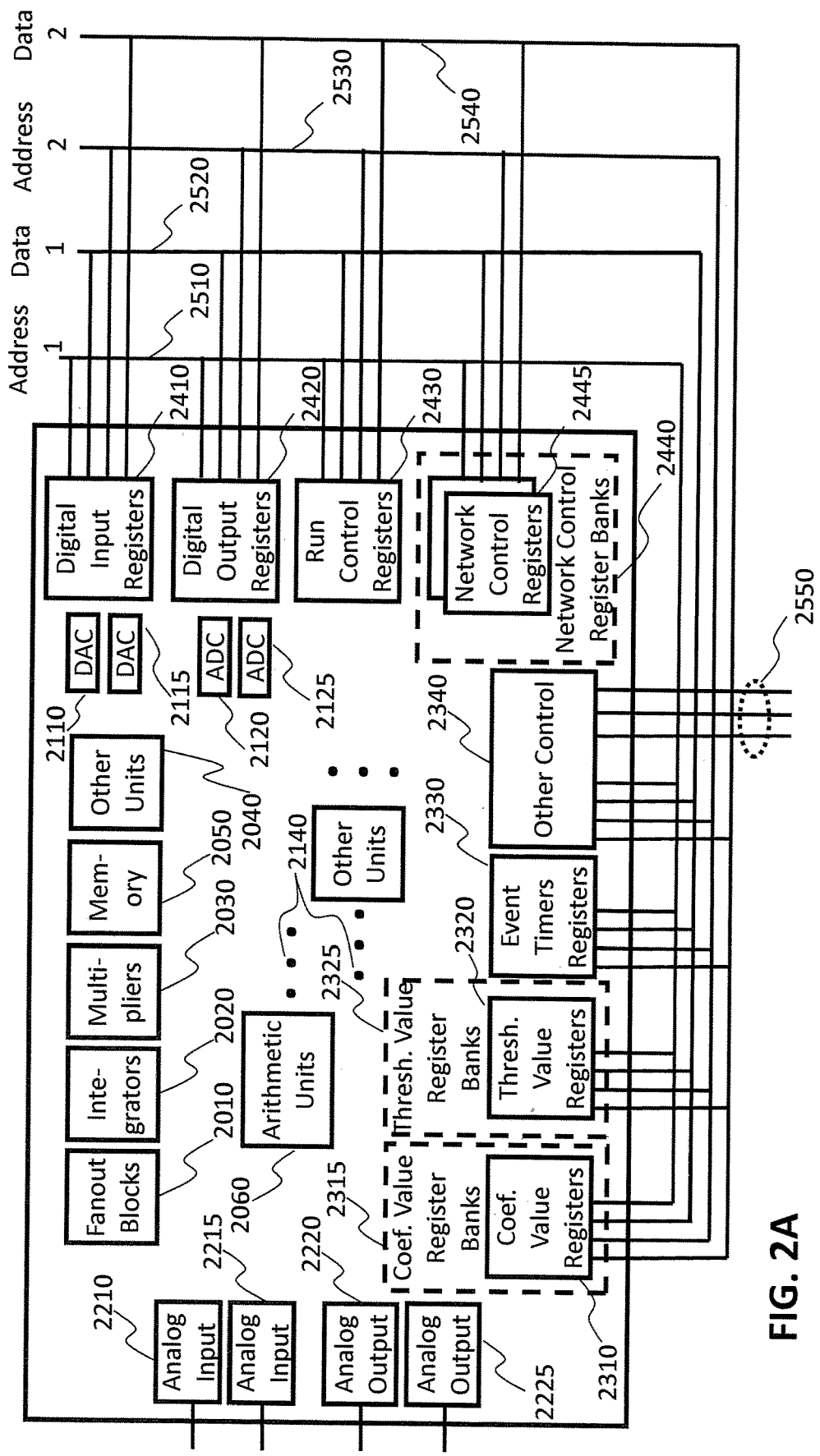
FIG. 2A depicts a block diagram for a configurable analog processing array according to some embodiments.

Referring now to FIG. 2A, a plurality of analog, digital, and mixed signal components and elements are illustrated. This may be, for example, in a reconfigurable analog processing array (RAPA) 1010 as described with respect to FIG. 1. In some aspects, each of the following listed components may be depicted as a single block or line or as two blocks or lines in FIG. 2A; however each block or line may represent a plurality of such blocks or lines or signals.

As depicted in FIG. 2A, component elements in a RAPA may include for example, but are not limited to: fan-out blocks 2010; integrators 2020; multipliers 2030; memory (both analog and digital) 2050; arithmetic units 2060; other units 2040 (for example, but not limited to, adders, accumulators, and other special purpose components, etc.); multiple digital to analog converters (DAC), or conversion components, again of which only two are shown in this simplified block diagram example, 2110, 2115; multiple analog to digital converters (ADC), or conversion components, again, of which only two are shown in this simplified block diagram, 2120, 2125; multiple analog inputs of which only two are shown in this simplified block diagram example, 2210, 2215; multiple analog outputs of which only two are shown in this simplified block diagram example, 2220, 2225; banks 2315 of coefficient value registers 2310; banks 2325 of threshold value registers 2320; event timers registers 2330; miscellaneous control registers 2340; digital input registers 2410; digital output registers 2420; run control registers 2430; and network or crossbar elements, including control registers 2445 organized into banks 2440, with each containing multiple network control registers. For some embodiments, each of the different types of registers depicted as a single block in the block diagram of FIG. 2A may represent a plurality of such registers. According to further embodiments, all of the components/elements in a RAPA may be interconnected in a number of different configurations for performing various analog functions and/ or operations using crossbar and/or switching fabrics 2140 that may be included as part of a RAPA 1010.

In FIG. 2A, the RAPA 1010 has a plurality of address lines 2510, 2530, which may correspond to those depicted and labelled as 1030 and 1050 in FIG. 1, and data lines 2520, 2540, which may correspond to those depicted and labelled as 1040 and 1060 in FIG. 1, as well as control lines 2550, which may correspond to those depicted and labelled as 1070 and 1080 in FIG. 1.

Figure 2B:
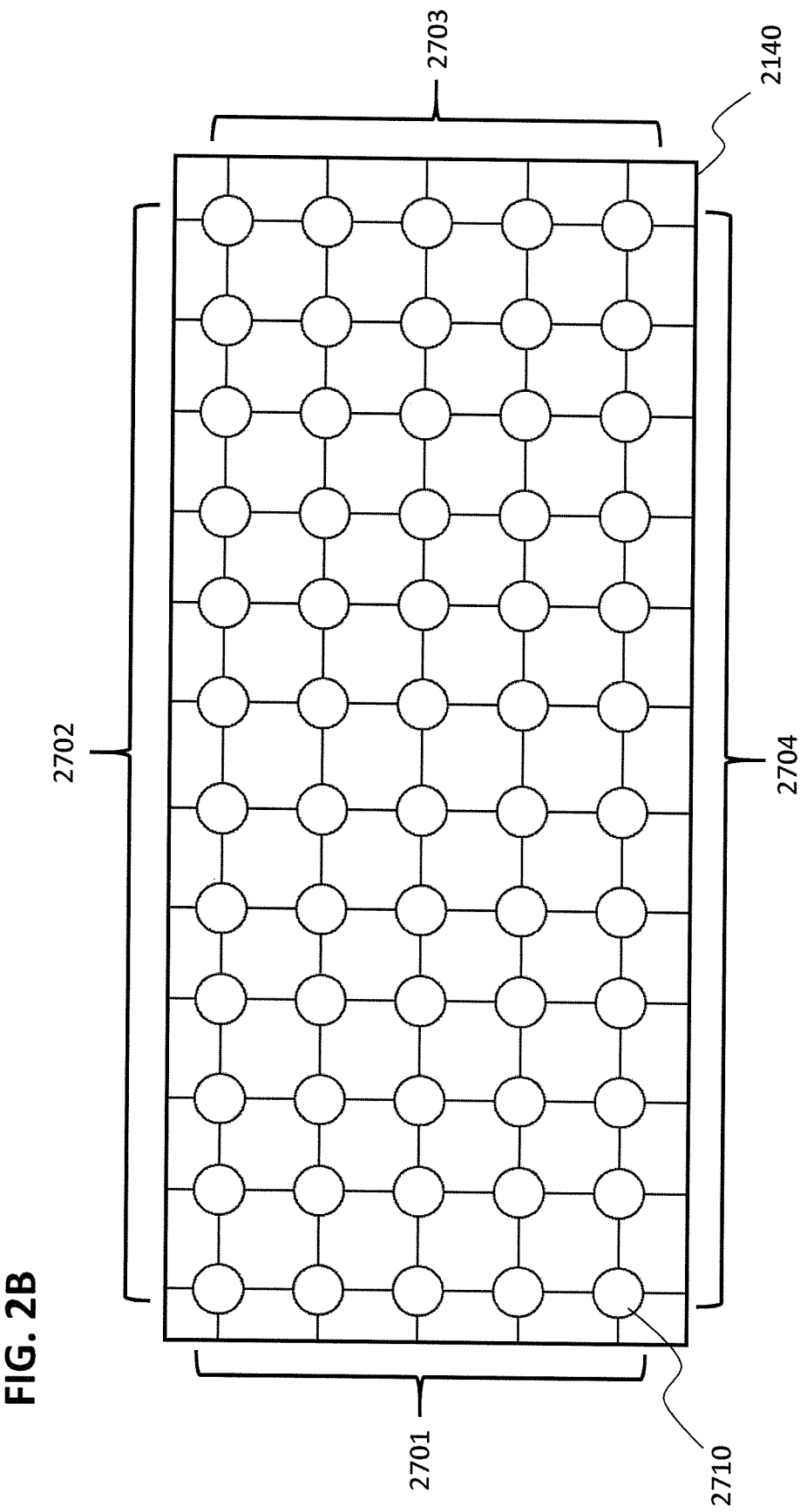
FIG. 2B depicts an illustration of a crossbar switch according to some embodiments.

According to some embodiments, the fan-out blocks (e.g., for transmitting the same analog signal to multiple blocks) 2010, integrators 2020, multipliers 2030, memory 2050 and other units 2040 are connected together via a programmable network, such as network 2140 illustrated in FIG. 2B. In some embodiments, the programmable network 2140, which may be a crossbar or a simpler network configuration, supports a plurality of component arrangements or configurations. The network control registers (NCRs) 2445 may be used to specify which RAPA components are to be selected, connected, and/or in what manner or sequence to form arrangements and configurations of the programmable network. This flexibility of arrangement may define, for instance, the RAPA's ability and configuration to perform a desired analog function or operation sing those components (once configured for that function or operation). In some embodiments, the fan-out blocks 2010, integrators 2020, multipliers 2030, memory 2050 and other units 2040 may be connected together in a variety of ways based on configurations encoded as digital values in the NCRs 2445. In this respect, the analog processing of the RAPA may be digitally programmed and controlled to perform specified functions.

For example, a first group of selected components in a RAPA, such as RAPA 1010, may be connected together and configured to provide a network of analog components to solve differential equations for an incoming analog signal (or digital signal converted by a DAC to an analog signal). In an alternative example, this same group of selected components, or other components separate from this group, but also in the RAPA, may be connected together to configure a network of components to serve as and implement functions such as, but not limited to, analog filters for incoming analog signals. This may be, for instance, as illustrated with respect to FIGS. 7A-7D, which provide an example of an implementation and arrangement for an FIR filter; or for some embodiments using a digital signal converted by a DAC to an analog signal.

According to some embodiments, configurations of the processing elements or components of the RAPA, such as the RAPA 1010, are determined by settings in multiple NCRs, such as NCRs 2445. For instance, multiple NCRs may be collected into banks in the network control register banks (NCRBs) 2440 and the banks will represent multiple different configurations. By using memory mapped registers in the NCR banks 2440, a particular bank of NCRs 2445 may be selected to designate the active configuration of a portion of the analog components to form the desired programmable network made up of those components. Different NCRs (in a bank or in different banks) may control different portions of the analog and/or digital components of a programmable network 1010.

In some aspects, since more than one group of NCRs are available in the NCR banks 2440, switching from one active configuration of at least a portion of the components of the programmable network to another different configuration or arrangement may be done rapidly. For example, as described later herein with respect to FIG. 6C, one portion of a RAPA's components and matrix network may be used in one configuration to bandpass filter a sampled analog signal, and then that same portion of components and network may be reconfigured to perform other multiple analog processing steps on that same bandpass filtered sampled signal and provide an output analog signal before the next sampled analog signal arrives to be bandpass filtered and then further processed. In certain aspects, the RAPA 1010 may be dynamically re-programmed using one or more NCRs to achieve a desired processing result.

As illustrated in FIG. 2A, and according to certain embodiments, the common address and data buses allow each of a RAPA's individual registers 2410, 2420, 2430, 2440, etc. to be managed as addressable registers, including as memory-mapped registers. For instance, in some cases, each register has a specified memory address and when that address is provided on an address bus, the register may be read from and/or written to by one or more digital elements, such as the digital cores in PDCA 1020.

In some embodiments, using the memory-mapped run control registers 2430, a variety of run-control or operational modes are possible. For example, the operation of a portion (or portions) of the analog array may be stopped, started, or paused. For example, one configuration being used to solve an Ordinary Differential Equation (ODE) may be paused while a different ODE configuration may continue running. These modes may be entered by writing an appropriate value to the appropriate run-control register. The current state of the configurable analog processing array (RAPA) 1010 may be determined by reading the value from the run control registers 2430. Particular values may be used to indicate the current state of the analog array switching fabric (or programmable network) 2140, such as for example, but not limited to, the array is currently stopped, running, busy, configuring or paused.

For ease of depiction and description purposes, some components are depicted as two blocks or lines in FIG. 2A; however each block or line may represent a plurality of such blocks or lines or signals. Alternatively, these registers may be in the PDCA 1020 instead of a RAPA as depicted in FIG. 2A, or portions may be in each of a RAPA 1010 and a PDCA 1020.

In some embodiments, multiple digital input registers 2410 may be present in the RAPA 1010. The digital input registers 2410 are memory mapped in this embodiment, and allow for digital inputs from external pins or internal sources to be supplied to the MSC 1000. By writing a value to the digital input register, the value may be provided to one of the multiple DACs (2110, 2115) in a RAPA. A DAC may take this digital value and provide it as an analog value to one or more analog or mixed signal components in the analog RAPA 1010; accordingly, a DAC is one type of conversion component. In some embodiments, for verification purposes, reading a digital input register 2410 provides the current value of the digital input register. Alternatively, these registers 2410 may be in a PDCA 1020 instead of a RAPA as depicted in FIG. 2A, or alternatively portions may be in each of a RAPA 1010 and a PDCA 1020.

In some embodiments, multiple digital output registers 2420 may be present in the RAPA 1010. These registers 2420 may be in the PDCA 1020, or alternatively portions may be in each of a RAPA and a PDCA. The digital output registers are also memory mapped in some embodiments. One of several ADCs (2120, 2125) may sample an analog value output by an analog component in the RAPA and provide the resulting digital value to a digital output register 2420; accordingly, an ADC is another type of conversion component. In some embodiments, a digital output from a component of the MSC 1000 may be written to a digital output register 2420. Several ADCs such as 2120, 2125 may be available for such use.

In some embodiments, there may also be multiple analog input blocks, such as 2210, 2215. These input blocks may be in the PDCA 1020 instead of a RAPA as depicted in FIG. 2A, or alternatively, portions may be in each of a RAPA and a PDCA. These input blocks may allow for an analog signal external to the MSC 1000 to be routed into it. For example, the analog input might come from an external pin, other components in the RAPA, or from another analog component in that same RAPA array, or from a different RAPA, or some other analog device or component.

According to some embodiments, there may also be multiple analog output blocks, such as 2220, 2225. These blocks may be in the PDCA 1020 instead of a RAPA as depicted in FIG. 2A, or alternatively, portions may be in each of a RAPA and a PDCA. These blocks may allow for an analog signal to be routed from the MSC 1000 to an external connection. For example, an external connection could be a device pin, or it could go to another analog component in that same RAPA array, or a different RAPA.

According to some embodiments, there may be several coefficient value registers 2310 in a RAPA. The coefficient value registers 2310 may be written to by one of the digital cores in a PDCA 1020. The digital value(s) written to the coefficient value register 2310 may be provided to the analog array 2140 as an analog value, or in some instances as a digital value. By way of example, usage of this type of value may be to provide the coefficients for a system of differential equations or the coefficients for a filter. In some instances, for verification purposes, reading a coefficient value register can provide the current value of the coefficient value register.

Additionally, there may be one or more threshold value registers 2320. The value in the threshold value register may be compared to an analog value in the RATA 1010. If the value in the threshold value register is exceeded by the analog value, either going above or below, a signal may be sent via the control signals 2550 to components in the array 1010 or in a PDCA 1020. The threshold value register block may be used in a variety of ways. For example, such a register may represent an analog function reaching a threshold in a minimization problem. Or, it might indicate that inputs or outputs of an analog circuit need to be rescaled. According to some embodiments, the RPA 1010 may include one or more memory validity checking and/or refreshing functions.

In some embodiments, there may be several event timer component blocks that may be configured and controlled by the event timer registers 2330. The event timers may provide a sophisticated counting mechanism. These blocks allow for a variety of functions such as for example, but not limited to waveform generation and counting of events.

Other control operations are possible. The other control block 2340 includes a variety of control signals that enter and exit that block, like those listed below. Additionally, other units block 2040 may include specialized versions of units already listed (e.g., fanout blocks 2010, integrators 2020, multipliers 2030, memory 2050, arithmetic units 2060) or other types of units, like for example, but not limited to, step functions, square root functions, higher power root function, absolute value functions, that might be incorporated to perform other specialized mathematical functions not listed here. Other control signals 2550 may also be available for a variety of functions including, but not limited to, status information, error notices, and run state.

Referring now to FIG. 2B, a portion of a switch 2140 according to some embodiments is provided. The switch 2140, may be, for instance, a crossbar network. According to some embodiments, the switch 2140 is comprised of an array of switching circuits 2710 to interconnect inputs 2701, such as 2210 and 2215 as shown in FIG. 2A, and outputs 2703, such as 2220 and 2225 in FIG. 2A, to functional units 2702 and 2704, such as 2010, 2020, 2030, 2040 and 2050 in FIG. 2A. Switch 2140 may also be used to connect functional units to each other by appropriately making connections at points (illustrated as circles) in a crossbar network. According to some embodiments, the crossbar switches are memory mapped, where each crossbar is either on or off determined by the memory cell controlling it. By turning on one or more of the cross bar switches, a signal may be routed from one location (i.e., an input) to a second (i.e., output) location. In some embodiments, by turning on additional switches, an input signal may be routed to more than one output.

Figure 3:
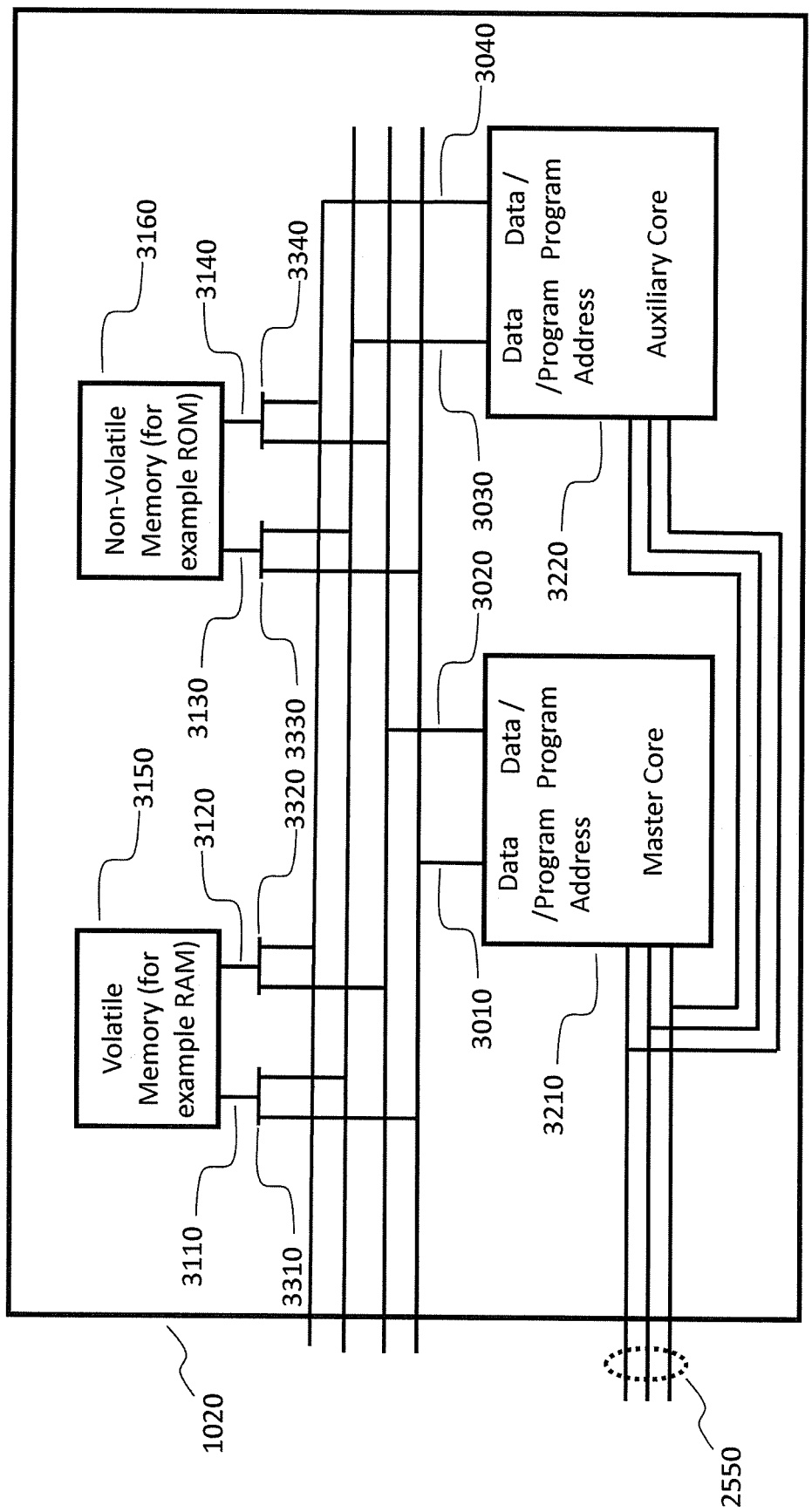
FIG. 3 depicts a block diagram of a programmable digital core array according to some embodiments.

Referring now to FIG. 3, an embodiment of a programmable digital core array (PDCA) 1020 according to some embodiments is provided. The PDCA 1020 may, for instance, comprise a master core 3210 and an auxiliary core 3220. The cores may be different, or the cores may be identical but the function they perform in the array may be different. For example, the master core 3210 may be used for configuring a portion of the analog components and network connection fabric in the RAPA 1010 to form one or more configurable analog arrays using the network control registers in one or more banks, including, for example, coefficient value registers 2310, event timers registers 2330, etc., described with respect to FIG. 2A. A digital core may also move values from memory to load into registers responsible for setting the run control registers to start, stop, or pause portions or all of the MSC 1000.

Similarly, and according to some embodiments, an auxiliary core 3220 may provide different functionality, such as for example, but not limited to, generating digital waveforms and sending those values to the digital input registers 2410 for sending into a configured arrangement of analog processing components that form an analog array for processing an analog signal (or signals) in a desired manner. As another example, an auxiliary core 3220 may preload values in the network control registers 2445 from a memory.

In some embodiments, the auxiliary core and the main core may both be used to configure different portions of the analog components and the network connection fabric, for instance, in RAPA 1010.

Further, a PDCA may, in some embodiments, contain more than two programmable digital cores. The functionality of a PDCA may be combined into a single programmable digital core in some embodiments. For ease of depiction and description purposes below, the components of FIG. 3 are depicted as a single block or line; however each block or line may represent a plurality of such blocks or lines or signals.

As shown in FIG. 3, each of the cores has at least a data/program address bus 3010, 3030 and a data/program bus 3020, 3040 according to some embodiments. This may be, for instance, used in connection with an array 1020 of FIG. 1A with more than a single address and a single data bus. These buses allow the individual cores to independently access memory and/or memory mapped registers.

As shown in FIG. 3, the PDCA also contains one or more memory components that the cores may use for program storage or data storage according to some embodiments. The one or more memory components may be a mix of volatile 3150 and non-volatile memory devices 3160. For example, but not limited to, the volatile memory might be some form of random access memory (RAM). And, for example, but not limited to, the non-volatile memory might be some form of read only memory (ROM). Other types of memory devices may also be employed in a PDCA. According to some embodiments, each memory block 3150, 3160 has an address bus 3110, 3130 and a data bus 3120, 3140. The memory blocks may contain program code or data that may be accessed individually by one of the programmable digital cores.

In some embodiments, a PDCA may include at least one master core 3210 and one auxiliary core 3220, and each may access each memory device in the PDCA, such as for example but not limited to memory block 3150 and 3160 in FIG. 3. In certain aspects, multiple types and blocks of memory devices are supported by multiplexers 3310, 3320, 3330, and 3340. A set of control lines, e.g., 2550, may carry information between the digital cores in the PDCA 1020 (e.g., master core 3210 and the auxiliary core 3220) and the registers or components of the RAPA 1010.

Figure 4A:
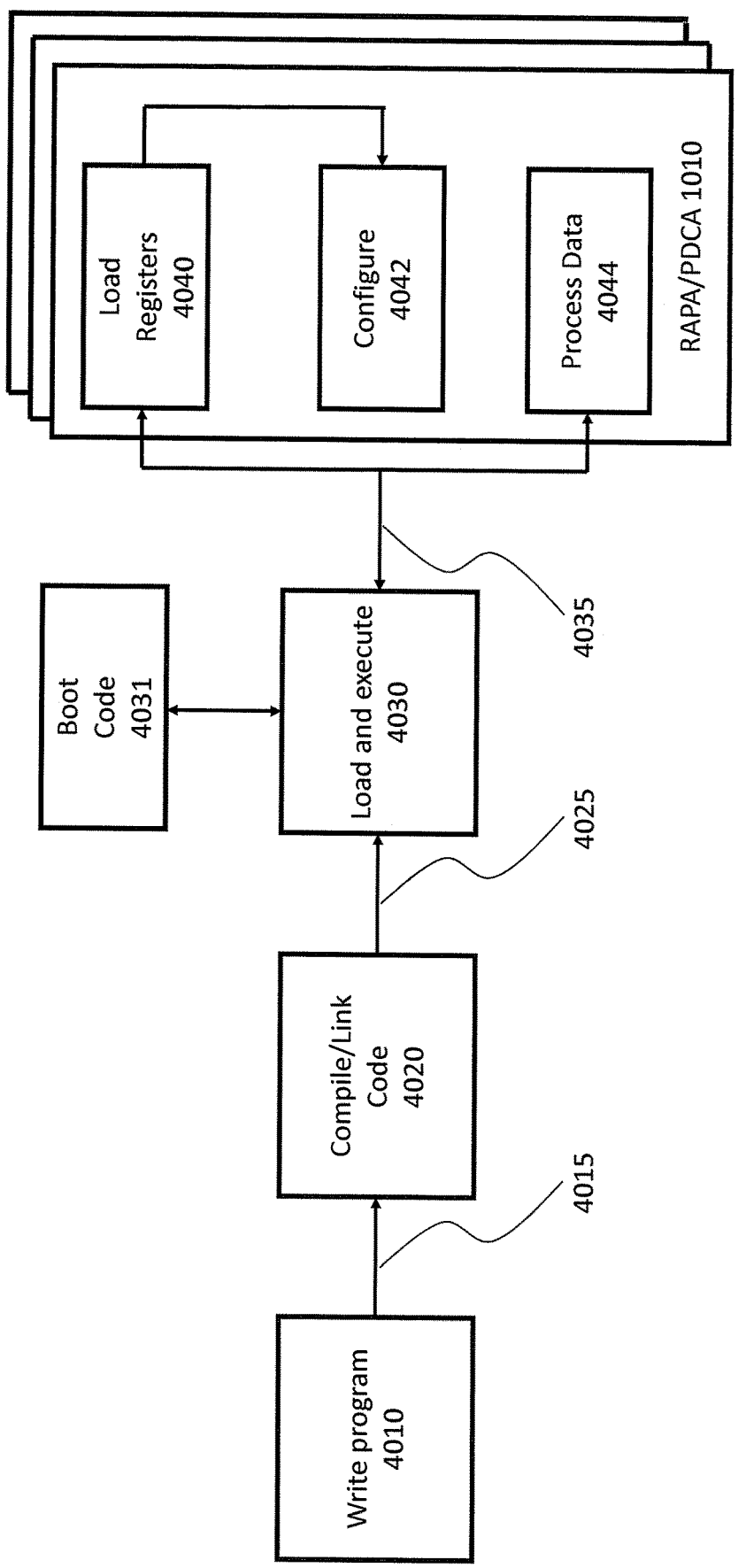

Referring now to FIG. 4A, a process 400 according to some embodiments is provided. The process 400 may be, for instance, a method for programming a mixed signal processor (MSP), such as MSC 1000. In some embodiments, a program is written 4010 which contains the instructions needed for the MSP to process the data 4044. In some embodiments, a program may be written in a high level language (HLL). In some embodiments, code such as that illustrated with respect to FIG. 4B may be implemented. The written program 4015 may be compiled and linked 4020 in order to create an executable code 4025 with which a Master Core (e.g., 3210) and Auxiliary Core (e.g., 3220) are programmed. The executable code 4025 may be used in combination with Boot Code 4031, for instance, as inputs to program 4030 of a Master Core and Auxiliary Core. According to some embodiments, once the Processor Cores (e.g., 3210, 3220) are programmed the Processor Cores begin the process of loading the register 4040 in the RAPA 1010 with the control information 4035. Specifically, but not limited to, the Network Control Registers 2445, Coefficient Value Registers 2310, Threshold Value Registers 2320, Event Timer Registers 2330, Digital Input Registers 2410, Digital Output Registers 2420, Run Control Registers 2430, and Other Control 2340 which are loaded and ready to configure 4042 the RAPA 1010. Once the RAPA is configured 4042, the data is processed 4044.

According to some embodiments, a method for programming an analog computer is provided using a written high level language, which may be used to replace the need for a patch panel. In some instances, the instructions (or directives) in the language would program the cross bar switch (connection fabric) along with sequencing the functions needed to process the signals of interest. In some embodiments, the HLL could incorporate the features of both the techniques used to program an analog computer (e.g., patch panels) and a digital computer (deploy processing elements to process the signals). In certain aspects, both the connections and functions are programmable.

Referring now to FIG. 4B, an example of code for execution on/in a PDCA, for instance in a master core and an auxiliary core, is provided. According to some embodiments, such code may execute a process 400 illustrated with respect to FIG. 4A. In some embodiments, the master core may be used to set up at least a portion of the components and switch fabric of the RAPA 1010, and the auxiliary core generates a synthetic digital waveform and sends it to the RAPA 1010 for processing. In some embodiments, a high level language (HLL) could be used to program the PDCA. In some instances, the written program would then be compiled and loaded in the memory of the PDCA where it would be executed by a Master core (e.g., 3210) and/or Auxiliary core (e.g., 3220).

In the example shown in FIG. 4B, the master core 3210, in line 4110, calls a function to load the network control registers for bank 0. The appropriate settings to load into the network control registers are saved in memory (e.g., 3150 or 3160 of FIG. 3) and this function is used to copy the values stored in a memory device of the PDCA into the memory mapped registers 2445 of the network register bank 0. According to some embodiments, arrangements may be fixed or otherwise set up for defined processing or arithmetic processing like for differential equations. In some embodiments, it is also possible to structure a new arrangement of components for a new processing pipeline.

In line 4120, a function is called to load the appropriate coefficient values to be used by the analog network. In this case, similar to line 4110, a bank is specified as bank 0. Similarly, the coefficient values are stored in memory and this function is used to copy the values stored in a memory device of the PDCA into the memory mapped coefficient value registers 2310.

In line 4130, the master core 3210 will wait for the auxiliary core 3220 to signal that it is ready. The cores 3210, 3220 will have communications means such as for example, but not limited to, handshakes, semaphores, and/or memory mapped registers. As the master core 3210 is performing these operations, the auxiliary core 3220 may be performing a different set of operations.

In the example shown in FIG. 4B, in line 4210, the auxiliary core calls a function to create a digital waveform. For example, samples of a cosine signal are created and stored in memory.

In line 4220, the auxiliary core 3220 waits for the master core 3210 to be ready. Additionally, lines 4130 and 4220 provide a synchronization point. In this example, before this synchronization point, the master core 3210 and auxiliary core 3220 have performed the necessary setup steps for further operations to be performed. After this synchronization point is reached, the master core 3210 will start the analog array 1010 to perform its selected function (Line 4140) and the analog core 1010 will begin sending data to the analog array (Line 4230).

According to some embodiments, next, the master core 3210 will wait for the auxiliary core 3220 to finish (line 4150). In line 4240, the auxiliary core calls a function to read data from the analog array digital output registers, e.g., 2420. When the auxiliary core 3220 is finished, at line 4250, it calls a function to signal to the master core 3210 that it is done. In certain aspects, once the master core 3210 determines that the auxiliary core 3220 is done, e.g., that is has completed its processing using the configured components of the RAPA (line 4150), the master core 3210 calls a function (line 4160) to stop the analog array 1010.

Accordingly, according to some embodiments, a method is provided for operating a mixed signal computer, including performing both analog and digital operations using analog and digital components, and controlling said analog and digital components with a programmed digital core, wherein said digital core may be programmed to configure analog and digital components to perform digital operations for a portion of the operations and analog operations for a different portion of the operations as a system design choice.

Figure 5:
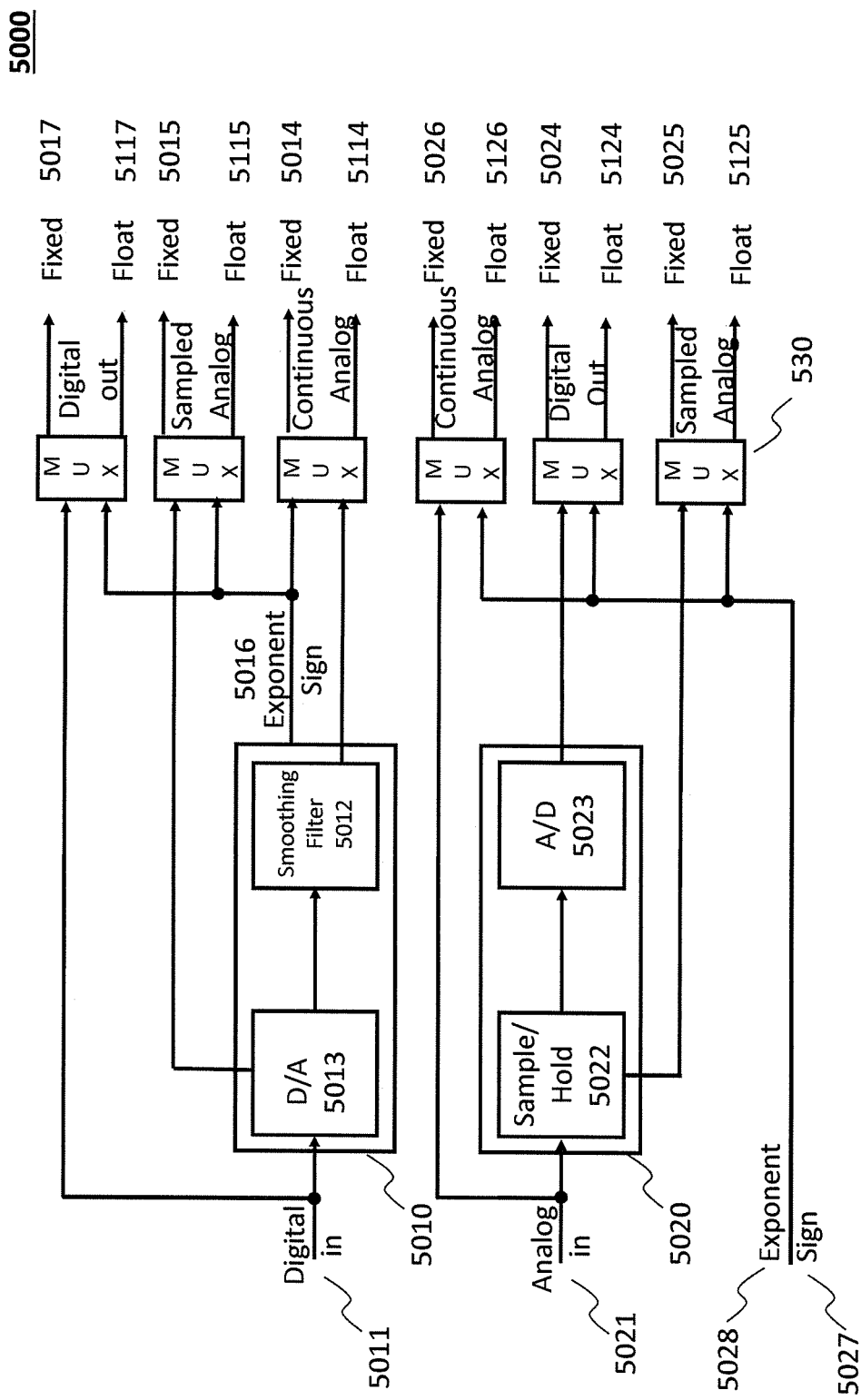
FIG. 5 depicts a signal conversion block according to some embodiments.

Referring now to FIG. 5, an example of how an ADC 5020 (such as 2120 and 2125 of FIG. 2A) and DAC 5010

(such as 2110 and 2115 of FIG. 2A) may be used to create multiple representations of a signal is provided. For instance, a real world analog signal 5021 may be represented by a continuous analog signal 5026 by being directly introduced to the RAPA components configured for processing the signal (or execution units). Alternatively, it may be represented by a sampled analog signal 5025 from the output of the sample and hold unit 5022 of an ADC 5020. Finally, it can be represented by a sampled digital signal 5024 after an analog to digital conversion 5023 is made. Note that each of the three output signals from the A/D converter may be either in a fixed point representation 5024, 5025 or 5026 or in a floating point representation 5124, 5125 or 5126 respectively by adding to each a sign bit 5027 and exponent value 5028. For some embodiments, in each output a multiplexer (MUX) 530 is used to configure the output signals. For example, the MUX 530 may take the analog output from the D/A block 5013 in the D/A converter 5010 and the Exponent and Sign 5016 from the D/A converter 5010 as inputs. The MUX 530 may also properly combine the two inputs to output the Sampled Analog Fixed Point signal 5015 and or the Analog Floating Point signal 5115. This same process could be used to produce each of the twelve (fixed and float versions) of the six possible outputs from the D/A converter 5010 or A/D converter 5020 in this example shown in FIG. 5. In some instances, if the digital input signal 5011 is in a floating point format or the resulting output 5014, 5015 is better represented in a floating point format, the sign bit and exponent 5016 are available to be combined with the analog output of the D/A converter 5010. For instance the output from either the D/A block 5013 or from the smoothing filter 5012 may become the analog mantissa for the mixed signal floating point output (e.g., either 5114 or 5115).

In the same way, a digital signal 5011 may continue to be represented as a digital signal 5017 by a direct connection to the execution units (which may be for example, the main 3210 and auxiliary 3220 cores, or other units described herein). Or it may be represented as a sampled analog signal 5015 from the output of the D/A converter 5013 of a DAC 5010. Finally the continuous analog representation 5014 is the output of the smoothing filter 5012 of the DAC 5010. In this embodiment, each of the three output signals from the D/A converter may be either in a fixed point representation 5014, 5015 or 5017 or in a floating point representation 5114, 5115 or 5117 respectively by the MUX 530 by adding to each fixed point output 5014, 5015 or 5017 a sign bit and exponent value 5016 generated by the D/A converter 5010.

According to some embodiments, and consistent with the foregoing, a signal introduced to MSC 1000, either analog 5021 or digital 5011 may be processed as either a digital signal 5017 or 5024, a sampled analog signal 5015 or 5025, as a continuous analog signal 5014 or 5026, or a mixed signal. Some signals may be represented as a combination using both analog and digital values; one example is a mixed signal floating point value where the mantissa is analog and the exponent is digital. According to some embodiments, aspects of the present disclosure relating to signal conversion (e.g., analog to digital) and storage may be used as an ADC, DAC, or exchange register.

Aspects of some embodiments provide for the conversion from one domain to the other (digital to analog or analog to digital). As such, mechanisms for checking or otherwise validating accuracy of such conversions are provided. For instance, a digital representation's equivalence of the analog representation.

In some instances, the equivalence between the digital and analog representations may be based on a comparison of the signal to noise ratio (SNR) for the two representations (i.e., analog and digital). In the analog domain the SNR may be determined by the ratio of the full scale analog signal divided by the noise floor; that is the largest possible signal value divided by the noise floor may be assumed to be the analog SNR. In the digital domain the same ratio may be determined by taking the largest value stored in a digital word (that is, assuming the largest value that may be stored in a digital word is when all of the bits in the word are ones (1s)). The digital noise floor may be determined to be the error associated with the least significant bit (LSB); this error is assumed to be one half the size of the LSB. When these two SNR representations are the same, the accuracies are equivalent. A simple example of this equivalence is to assume an analog signal with a full scale value of 10 volts and a noise floor of 10 millivolts, giving an analog SNR is 1000. To determine the digital equivalent of the analog SNR, the word size needs to be determined with a digital SNR of 1000. In this case, the number of bits required to represent a SNR of 1000 can be determined by dividing the most significant bit (MSB) by half of the LSB and solving for "n" where "n" is the number of bits in the digital word. Given 2 to the $10^{th}$ power is 1024, and this represents the (n+1) power, the bit equivalent of the analog signal with an SNR of 1000 is 9 bits (2 raised to the (n+1)th power where n=9).

Figure 6A:
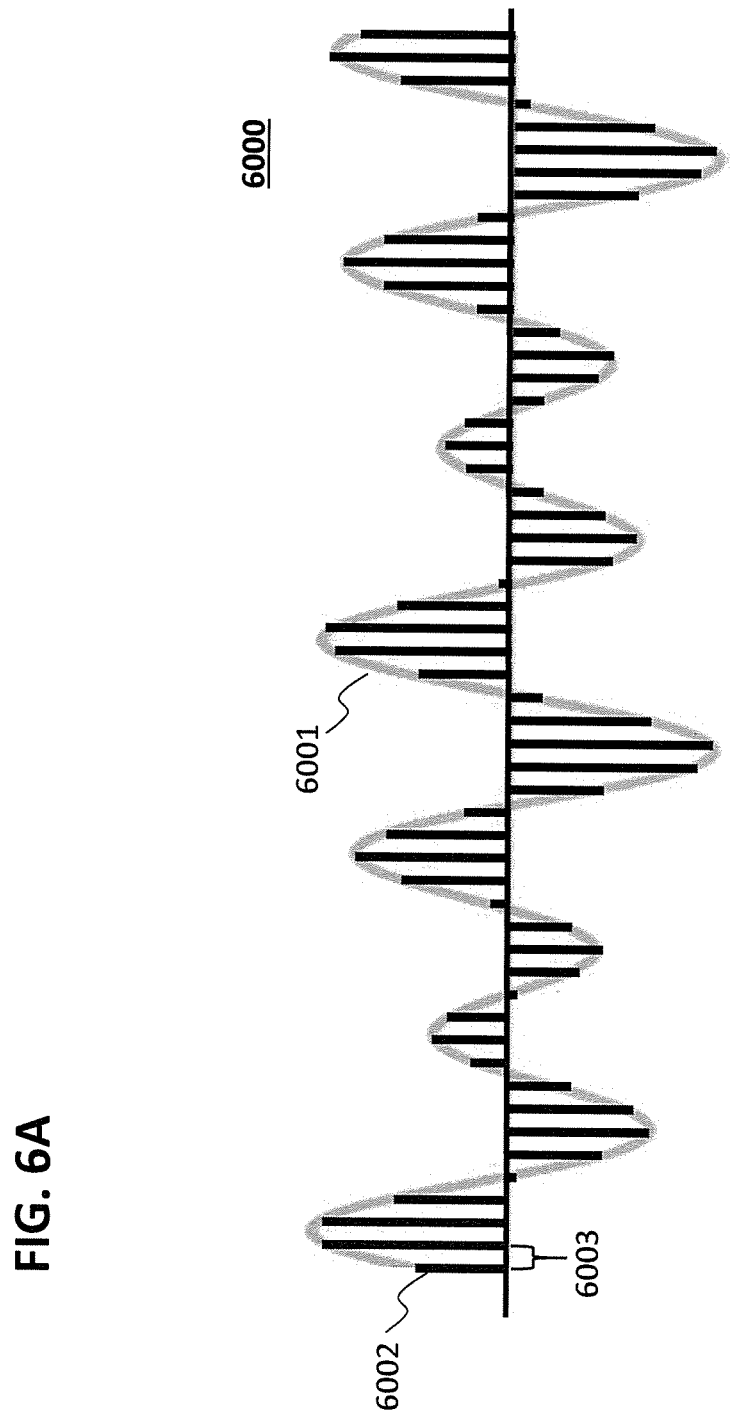
FIGS. 6A and 6B depict a sampled analog signal according to some embodiments and FIG. 6C depicts a block diagram of a processing block according to some embodiments.
Figure 6B:
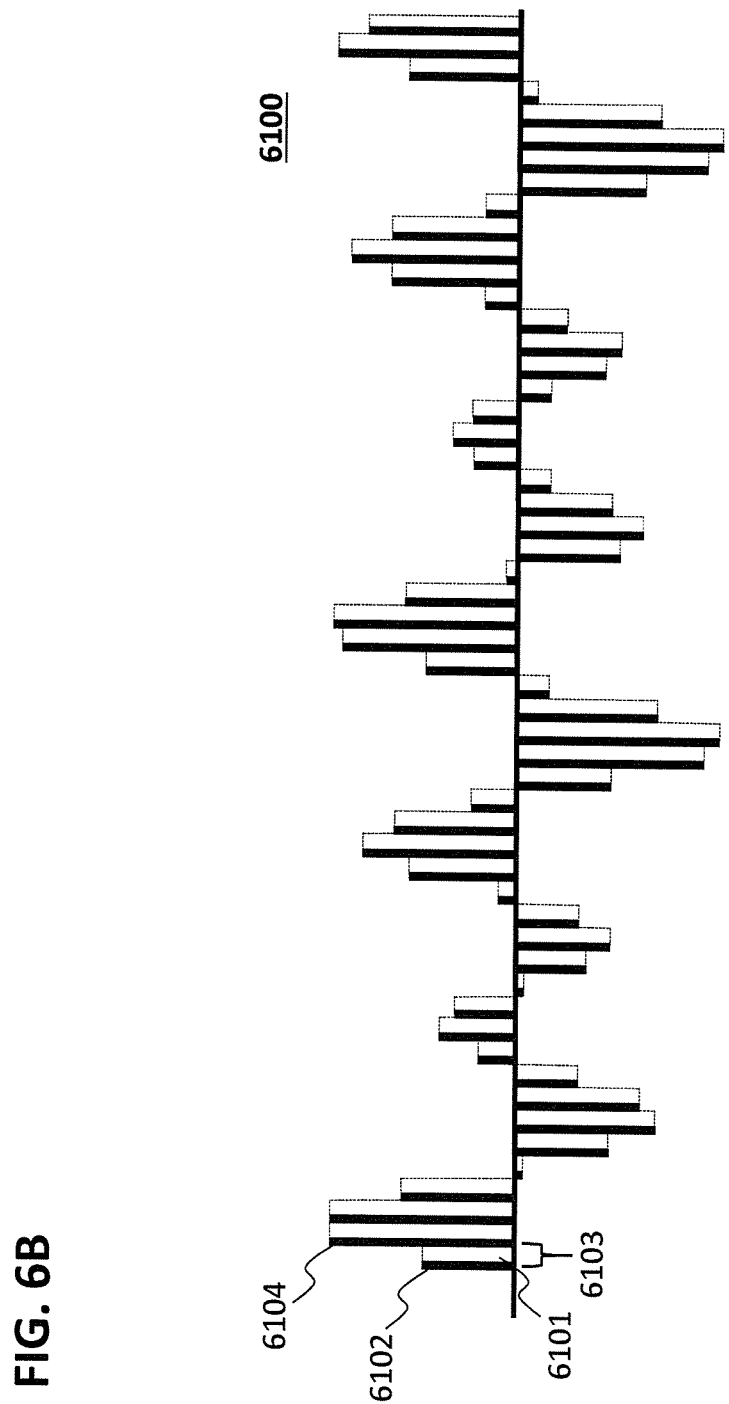
Figure 6C:
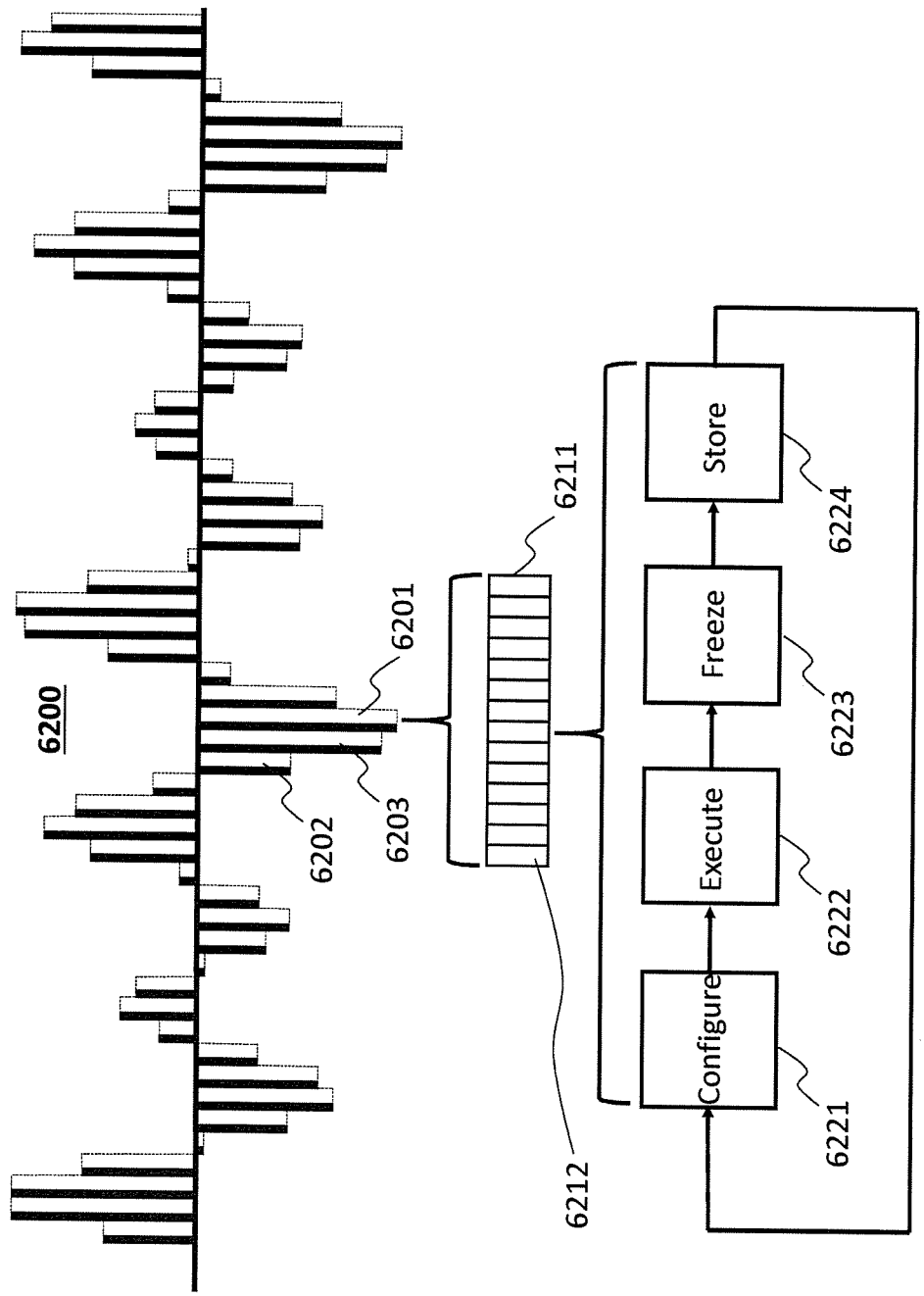

Referring now to FIGS. 6A, 6B and 6C, there is provided a depiction of how a real world signal 6001 may be processed by RAPA components configured to be computational or execution elements, for instance, in connection with embodiments discussed herein.

FIG. 6A depicts an analog signal 6001 which has been sampled 6002 at a periodic rate 6003. According to some embodiments, these samples 6002 are converted to a digital representation using an analog to digital converter (ADC) 5020 with the output of the ADC 5024 ready to be further processed. In the digital domain, the digital representation of a real world signal 6001 may be defined at the point in time that the signal is sampled and is undefined between samples. The sampled signal 6002 as represented by all of the vertical lines represented in FIG. 6A are instantaneous points in time and the amplitudes of the signal 6001 in the time between the samples 6003 are not defined.

Now referring to FIG. 6B, the amplitude 6102 of the signal 6001 versus time is depicted for a sampled analog system 6100. Accordingly, the signal has a value during each time period 6103 between each of the sampled points 6102 and 6104. The value 6102 needs to remain constant 6101 until the next sample is taken 6104. This is done, for instance, using the output of the sample and hold circuit 5022 (depicted in FIG. 5).

Now referring to FIG. 6C, a sampled analog signal 6201 from the sample and hold block 5022 is depicted, and the signal 6201 may be processed in the analog domain using a desired math function represented by execute step 6222, according to some embodiments. When the analog math or other analog functions perform significantly faster than the length of time for a sample period 6103, the sample period may be time sliced 6211 into N execution times 6212 for analog or computational components configured to perform or execute analog functions or operations. During each time slice, the analog math functional units 2010, 2020, 2030, 2040, 2050, and 2060 are configured (step 6221). Once configured, the appropriately configured analog functional units are executed (step 6222). Once the execution is complete, the state of the functional units can be frozen (step 6223), stored (step 6224), and then reconfigured (step 6221) to perform the next analog function or operation. Therefore, multiple math or other analog operations may be performed on each sample 6201 before the next sample is "taken". Further, previous analog samples, for example 6202 and 6203 may also be manipulated during the time slices in 6211.

FIGS. 7A-D depict an example of how a mixed signal computer 1000 may be programmed to perform a signal processing function according to some embodiments. As shown in FIGS. 7A-D, the example is of a four tap Finite Impulse Response (FIR) filter. The FIR filter is used extensively in signal processing applications and can be found as a fundamental building block in engineering and business applications. The FIR filter can also be referred to as a Moving Average function.

Figure 7A:
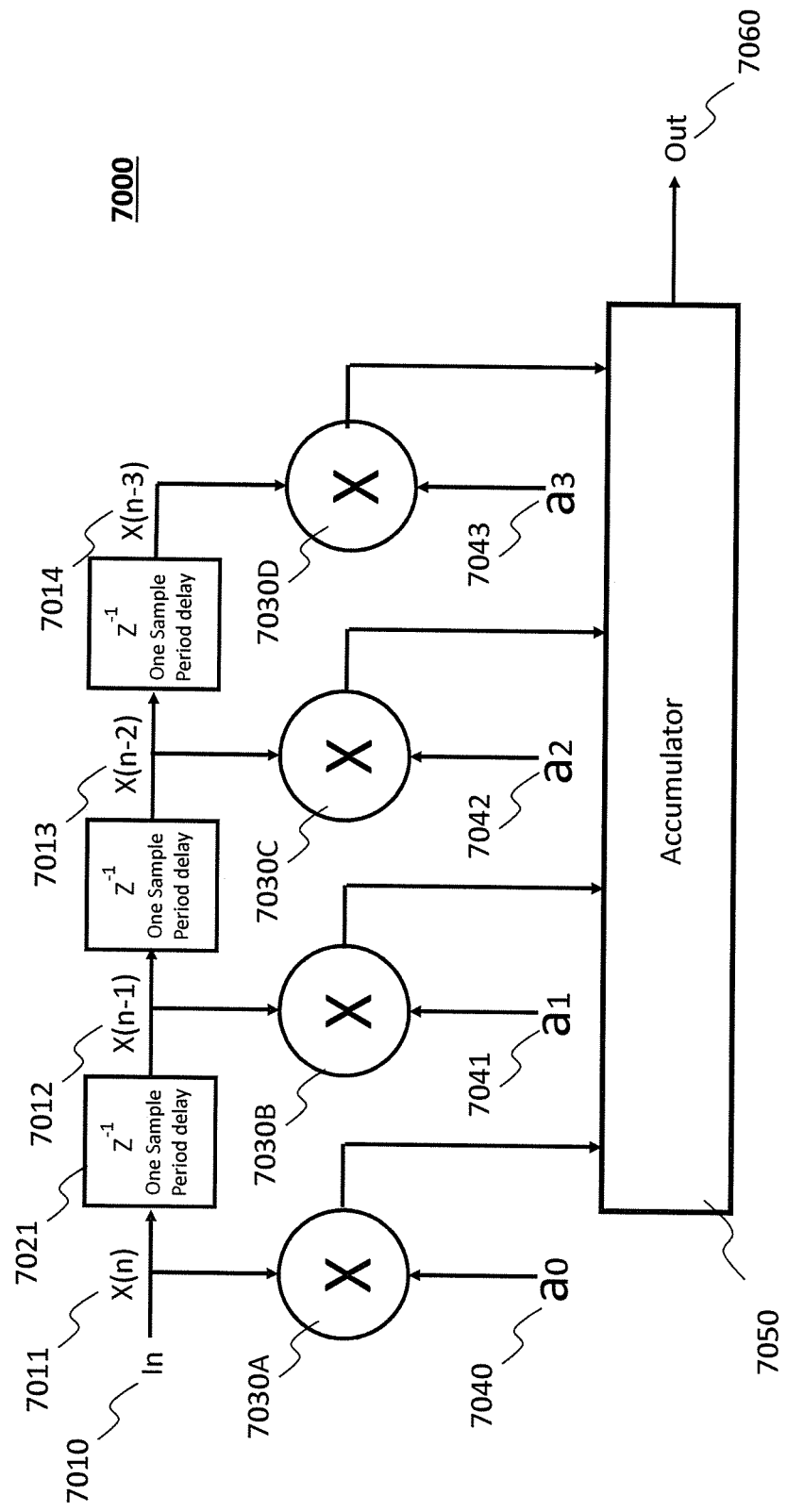

Now referring to FIG. 7A, a block diagram of a simplified digital implementation of a four tap FIR filter 7000 is shown. In some embodiments, the FIR filter 7000 may comprise an input 7010 and an output 7060. The input In 7010 may comprise digital representations of the input signal. A present input sample X(n) 7011 and the three previously input samples X(n−1) 7012, X(n−2) 7013, and X(n−3) 7014 respectively are shown in FIG. 7A. A one sample delay is used to assure that the output sample 7060 is the weighted sum of the present input sample X(n) 7011 and the three previous input samples X(n−1) 7012, X(n−2) 7013, and X(n−3) 7014. During the sample period, the four input samples X(n) 7011, X(n−1) 7012, X(n−2) 7013, X(n−3) 7014 are each multiplied by a coefficient, a0 7040, a1 7041, a2 7042 and a3 7043, respectively. The results of the four multipliers 7030A-D are added together in an accumulator 7050, providing the output 7060 for the present sample period. In some embodiments, this process may be repeated for each sample period with a new X(n) 7011. In such embodiments, the previous X(n) is delayed and becomes X(n−1) 7012, the previous X(n−1) becomes X(n−2) 7013, etc. These operations may be performed by a digital core suitably controlled by a program for these various steps, like an auxiliary core 3220 of FIG. 3.

Figure 7B:
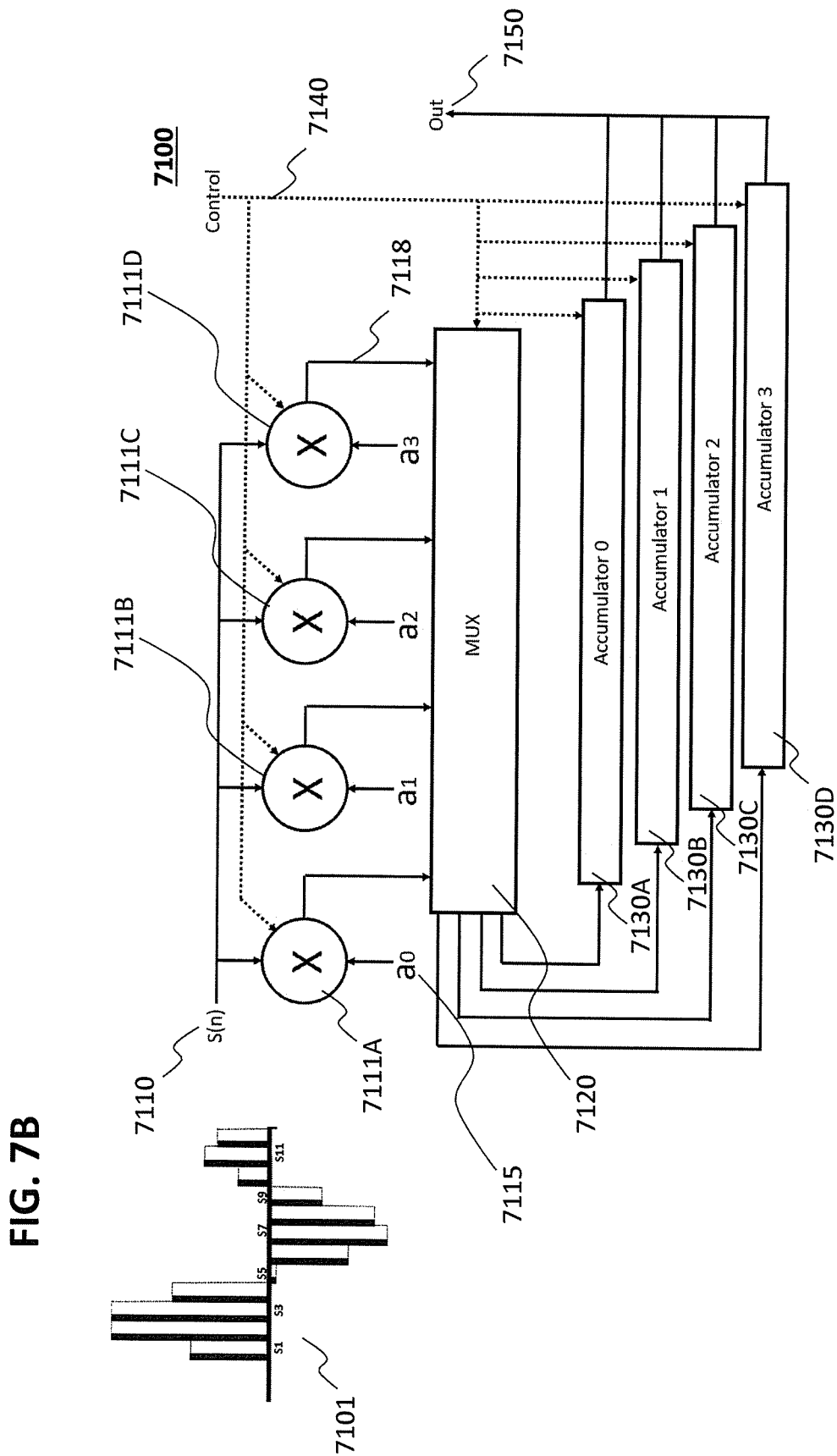

FIG. 7B depicts how the same four tap FIR filter may be implemented in a sampled analog implementation. According to this implementation, the analog FIR filter 7100 may receive analog data points (e.g., S1 through S12 in signal segment 7101) as inputs. As shown in FIG. 7B, the analog FIR filter 7100 may comprise an input 7110 and an output 7150. The analog components in a RAPA, e.g., 1010, could be configured to provide the functional analog units, which are in this embodiment the four multipliers 7111 where the input S(n) is multiplied by the coefficients a1, a2, a3 and a4 7115; the multiplexer (MUX) 7120; and the four accumulators 7130A-D, as depicted in FIG. 7B. In some embodiments, each of the analog functional elements have been configured by and are under the control 7140 of the network control registers (e.g., 2445 of FIG. 2A) of a MSC 1000.

FIG. 7C shows a table 7200 depicting the function (i.e., the arithmetic operations) of each functional element of the analog FIR filter 7100 during sample periods P1 through P12, where the sample periods P1-P12 comprise time slices (S1-S12) of the analog signal 7101 being processed. The columns of the table 7200 comprise a list 7221 of the sample periods P1 through P12 in column 7210, a list of the results of the multipliers 7111A-D in column 7224, the results of the multipliers 7111A-D added to each accumulator 7130A-D in columns 7211, the list of which accumulator 7130A-D output is output 7150 from the analog FIR filter 7212 and finally, what result 7223 is output in column 7213 during each sample period P1-P12.

Looking at sample period P1, the output of the four multipliers 7111A-D placed in each of the four accumulators 7130A-D are the results of Sample 1 (S1) multiplied by coefficient (a0) 7230, S1 times a1 (shown as S1a1) 7231, S1 times a2 (shown as S1a2) 7232, and S1 times a3 (shown as S1a3) 7233. Each of the results 7230, 7231, 7232, 7233 is added to accumulator 0 through 3, items 7130A-D, respectively. Now looking at only accumulator 0 7130A during a sequence of sample periods P1 through P4 indicated by box 7224, accumulator 0 7130A has the sum of the needed four multiplications to form the correct output 7230 at the end of the P4 sample period, that is S1a0+S2a1+S3a2+S4a3=out (P4). As further examples, output 7233 for sample period P5 is from accumulator 3 7130D, the output 7232 for sample period P6 is from accumulator 2 7130C, and so forth.

FIG. 7D shows a table 7300 depicting a different arrangement of the same information found in table 7200. That is, table 7300 shows that a sequence of actions occurs during each sample period specific to the time slices in column 6211 of the period. For example during the first time slice 6212 of sample period P1 7331, Accumulator 0 (ACC0) 7130A is set to zero in box 7341, preparing ACC0 for the first multiplication result performed in time slice 2, sample S1 times coefficient a0 (S1a0) 7341, which is added to ACC0 in time slice 3. After these three time slices, the sample S1 is multiplied by the each of the three remaining coefficients (a1, a2, a3) with each added to the appropriate accumulators for the next 6 time slices (4-9) in sample period P1. Now looking at each of the sample periods (Pn) 7331-7337, one of the four accumulators 7130A-D is set to zero in time slice 1 of each sample period. In time slice 2, 4, 6 and 8 of each of the sample periods (Pn) 7331-7337, the sample of that period (Sn), is multiplied by a0, a1, a2, a3 respectively. The results are then added to the appropriate accumulator (ACCn) in time slices 3, 5, 7 and 9. This may continue down the time slices with the sample of each period being multiplied by the coefficients and then added to the appropriate accumulators. Looking now at the time slices encircled by 7340, and specifically at sample period P4 7334, a tenth time slice is added to each of the sample periods. During this $10^{th}$ time slice, the four samples (S1-S4) which have been multiplied by the four coefficients (a0-a4) with the results added to ACC0 7130A (which has been set to zero in time slice 1 of sample period S1 7341) in time slices 2-9 are output 7344. This process continues during each time slice from sample period four (P4) on. That is, during each of the sample periods (Pn), one of the accumulators 7130A-D is set to zero, the results of four multiplications are added to the appropriate accumulators, and one of the accumulators is outputted.

According to some embodiments, the first three sample periods 7222 are not included in an output as none of the accumulators 7130A-D have the required four results needed for a valid output. Further, in some instances, at the beginning of each new accumulation within an accumulator 7130A-D, for example in the block of accumulator 0 (as shown in 7224 and 7341), the accumulator is set to zero. Each sample period may be divided into multiple times slices 6211 (like those in FIG. 6C) in such a way that only one multiplier is physically needed to perform all four multiplies using the steps of 6221, 6222, 6223 and 6224 shown in FIG. 6C during each time slice 6212. This can be illustrated, for instance, with reference to FIG. 7D. In some embodiments, the number of time slices for the analog filter 7100 of length n will be equal to 2n+2.

For simplicity, only a four tap FIR filter has been used as an example. However, the foregoing technique is not limited to only four taps, but as many taps as may be executed using the available execution units and time slices during each sample period (Pn). Further each time slice does not need to be uniform and all of the processes (multiply, add, accumulator management, signal input and output of the filter) may be performed without a slice clock.

Figure 7E:
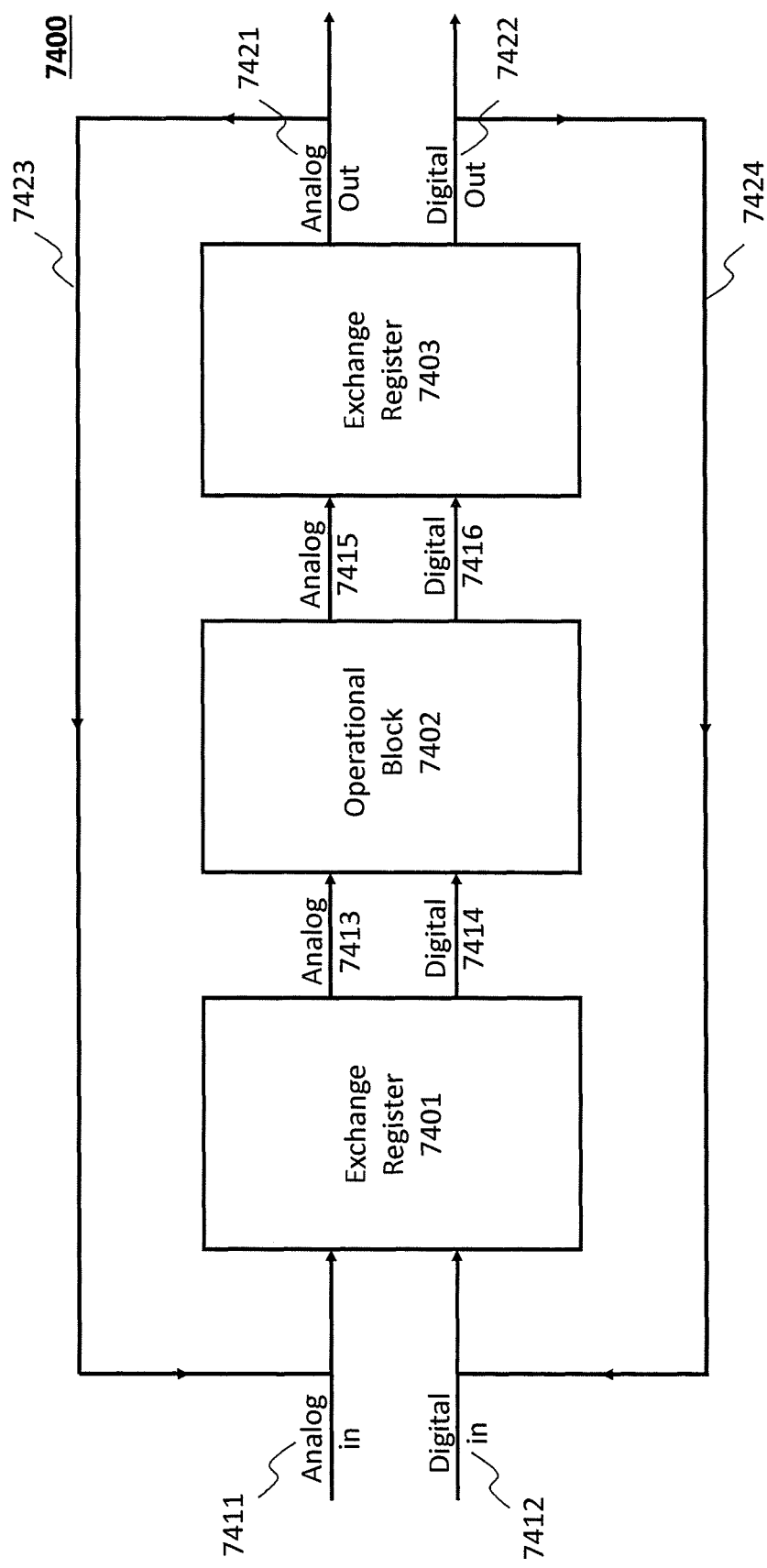
FIG. 7E depicts a functional block according to some embodiment.

Referring now to FIG. 7E, an example of a representative functional block is depicted 7400, according to some embodiments. In this embodiment, the functional block 7400 performs a specific processing function, for instance, like that depicted in FIG. 7B. The functional block 7400 includes two exchange registers 7401, 7403 (see FIG. 5 for an exemplary embodiment of an exchange register) and an operational block 7402. The operational block 7402 includes a predetermined set of functional components (see FIGS. 2 and 3) which have been configured to perform a specific operation (see for example, but not limited to FIGS. 7A, 7B, 8A and 8B). Once configured, either an analog signal 7411 or digital signal 7412 may be provided as an input to the exchange register 7401. The exchange register converts the signal to the needed representation or format, either analog 7413 or digital 7414, for use in the operational block 7402. Once the processing is completed in the operational block 7402, the appropriate result is provided as an output, either analog 7415 or digital 7416 to an exchange register 7403. The signal is then converted to the representation or format needed operation for the next operational block and provided as an output in either an analog representation 7421, digital representation 7422, or both. In some embodiments, the output signal may be returned to the other exchange register 7401 in preparation for use by the operational block 7402 once reconfigured (see for example, but not limited to FIG. 6C) for the next operation. In certain aspects, the returned signal may also be sent back directly to the operational block 7402 as an input 7413 or 7414, although not shown in FIG. 7E.

Figure 8A:
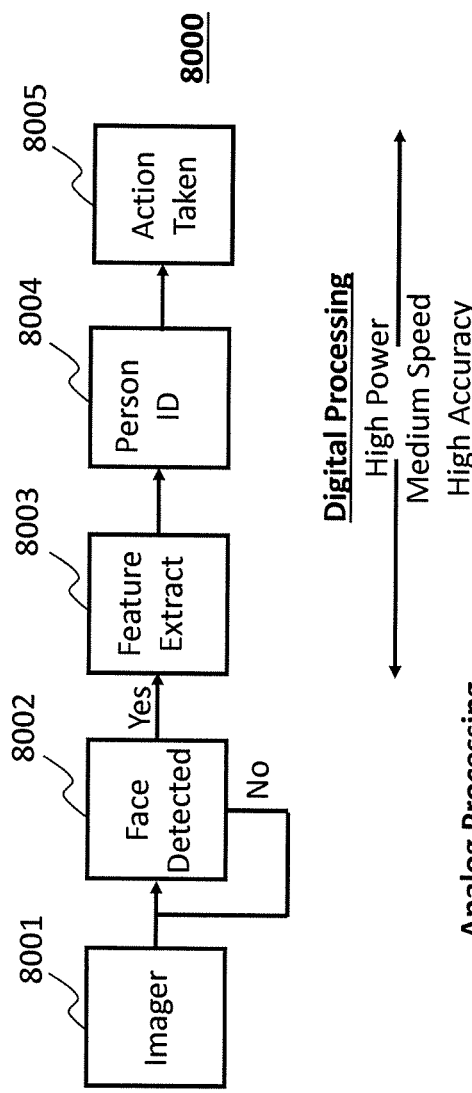
FIGS. 8A and 8B depict mixed signal processing flows according to some embodiments.
Figure 8B:
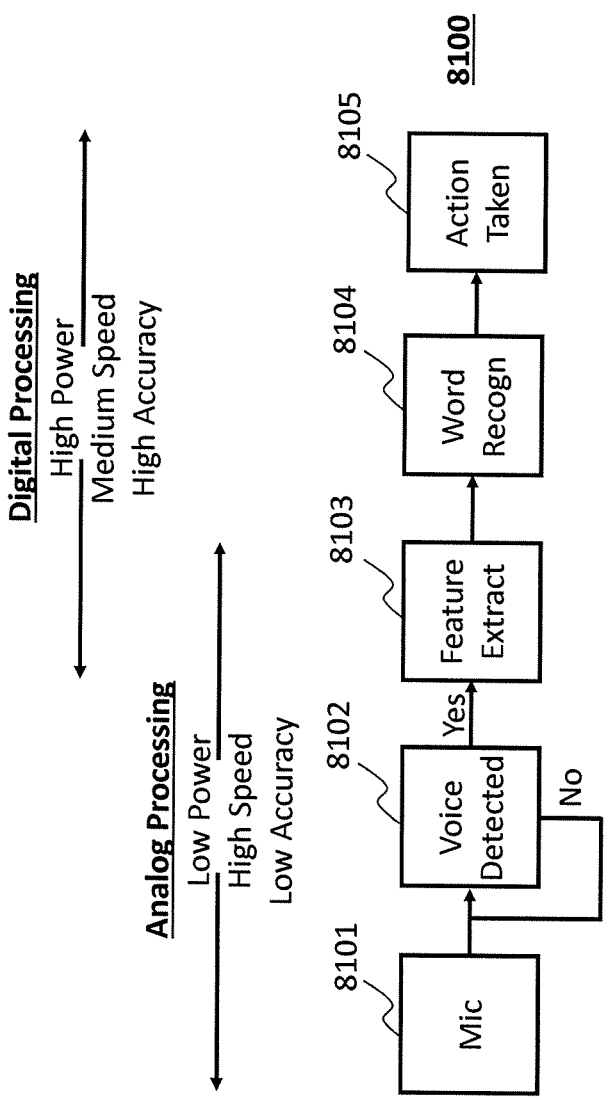

FIGS. 8A and 8B are two examples of analog signals for which mixed signal operations may be combined in a MSC 1000 to optimize the tradeoff among performance (speed), power dissipation (battery life), and accuracy according to some embodiments. Mixed signal operations may be best defined as using both analog and digital functional units to interactively operate on a signal of interest. Referring to FIG. 8A, a face detection system 8000 according to some embodiments is depicted. The face detection system 8000 has an imager 8001 as its input, where the pixels from the imager are the input to a face detector 8002. The function of the face detector is to continuously evaluate whether or not a face has been detected. This function requires ultra-low power dissipation while processing the imaging data in real time. Once a face has been detected, the pixels from the imager are further processed to extract the features necessary to identify the face 8003. These features are then used to identify the individual 8004. Finally, once the individual is identified appropriate action is taken 8005. As the first two functional blocks 8001 and 8002 are continuously on, it is important the two function blocks 8001 and 8002 are performed in the analog domain to minimize the power dissipation (increasing the battery life in the case of a battery operated device). For example, but not limited to, block 8001 may be a CMOS imager or another type of imager and 8002 may be an analog filter or transform (FIG. 7 illustrates a simplified example of an FIR filter using both digital and analog representations). The last two functional blocks 8004 and 8005 require high accuracy in order to make a correct identification and then appropriately act. Therefore when accuracy is needed, the data can be processed digitally. Finally the feature extraction function 8003 may be performed either in the analog domain or in the digital depending on the tradeoff between the required performance and accuracy needed in the remainder of the process 8004 and 8005.

Referring now to FIG. 8B, a voice recognition system 8100 is provided according to some embodiments. The voice recognition system 8100 may have a similar set of functional blocks as in 8000, but optimized for detecting a voice signal rather than an image. In this example, a microphone 8101 continuously listens to the surrounding area and sends the audio signal to a voice detector 8102. The voice detector 8102 determines if there is a voice signal or not. If there is a voice signal, the voice data is sent to the feature extraction block 8103 where the appropriate features are extracted. Once extracted, the features are sent to the word recognition functional unit 8104 where the words, phrases and other sounds are determined. Once the speech data is converted to words, phrases and sounds, the converted speech data is sent to the last functional unit 8105 for appropriate actions to be taken. As in the face recognition embodiment 8000, the voice recognition embodiment 8100 has the same tendency to need the capabilities of analog processing in the first half 8101 and 8102 of the process while needing the capabilities of digital processing in the last half 8104 and 8105. The middle functional element (e.g., feature extract 8003, 8103) is in an area of overlap and may be either analog or digital.

According to some embodiments, a method for operating a mixed signal computer is provided, which includes performing both analog and digital operations using analog and digital components, and controlling said analog and digital components with a programmed digital core, wherein said digital core may be programmed to configure analog and digital components to perform digital operations when maximizing accuracy/precision for a portion of the operations and analog operations when minimizing power for a different portion of the operations as a system design choice.

Figure 9:
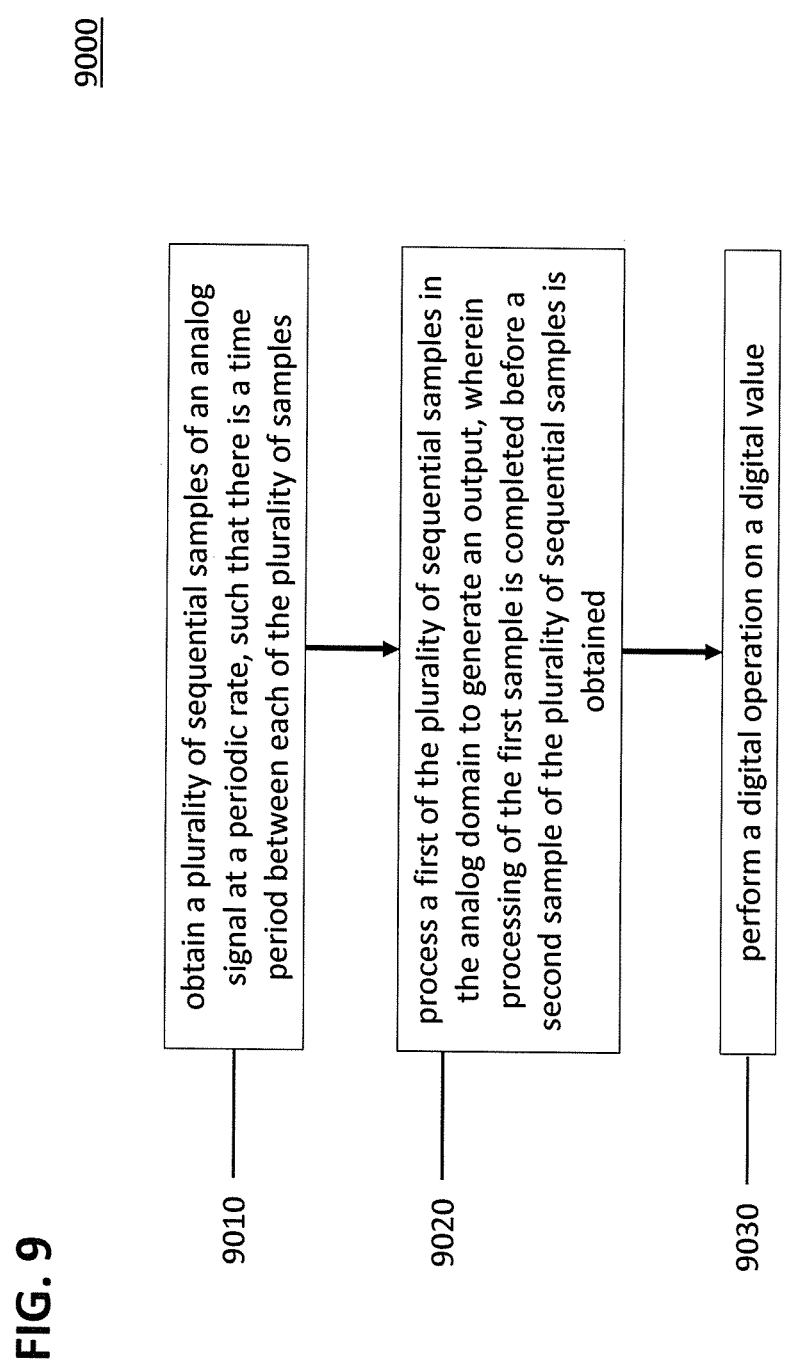
FIG. 9 is a flow chart of a method according to some embodiments.

Referring now to FIG. 9, a process 9000 for processing mixed signals is provided according to some embodiments. In step 9010, a plurality of sequential samples of an analog signal are obtained at a periodic rate, such that there is a time period between each of the plurality of samples. In step 9020, a first of the plurality of sequential samples is processed in the analog domain to generate an output. In certain aspects, processing of the first sample is completed before a second sample of the plurality of sequential samples from step 9010 is obtained. In step 9030, a digital operation is performed on a digital value. According to some embodiments, the same signal (or in the same signal flow) is processed in both an analog representation and a digital representation. According to some embodiments, two different signals (or two different signal flows) processed simultaneously, for example, one using a digital representation and the other using an analog representation. In certain aspects, the signal flow will remain with the same representations throughout from input to output. In some embodiments, a signal flow may change representations multiple times. The flow may also start with either representation and end in either representation.

Figure 10:
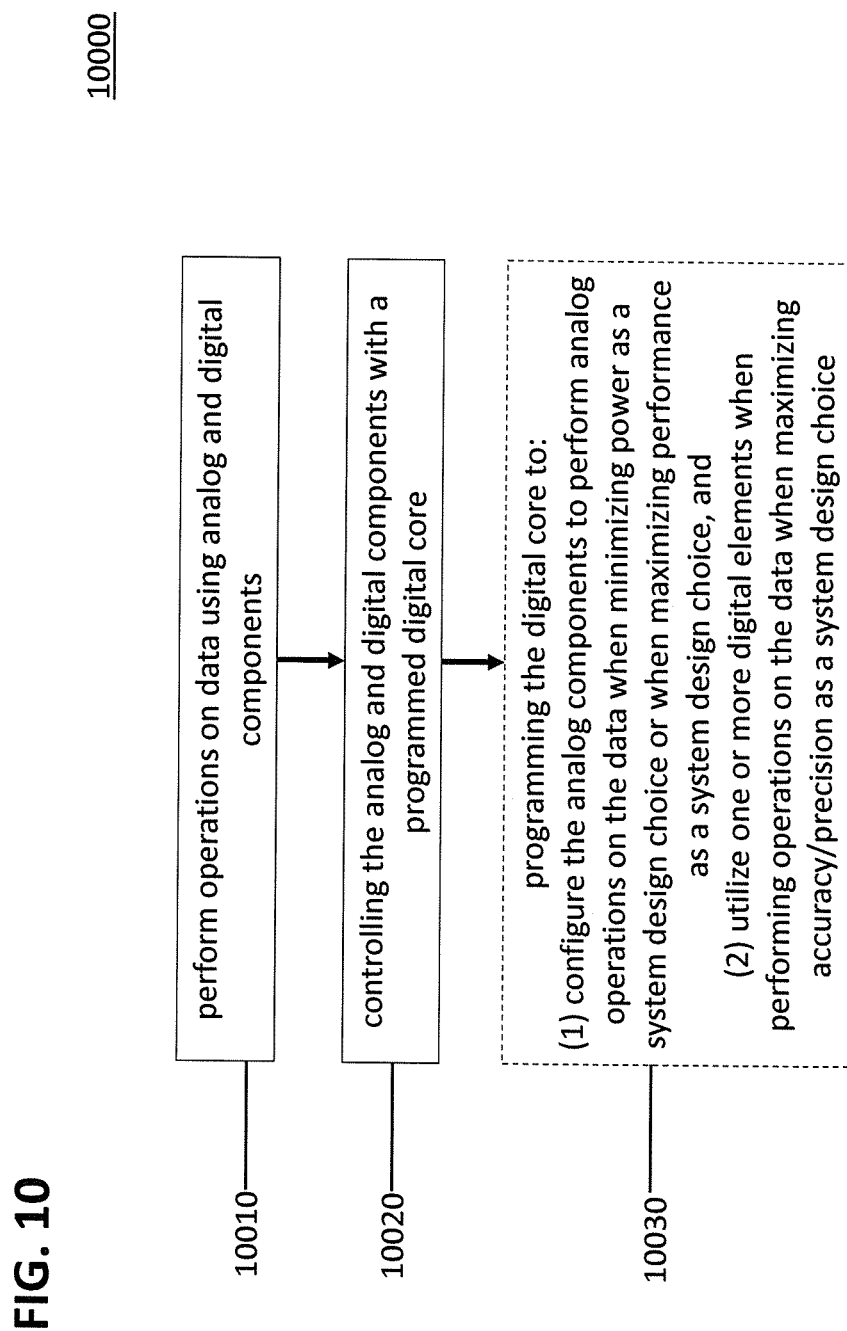
FIG. 10 is a flow chart of a method according to some embodiments.

Referring now to FIG. 10, a process 10000 for mixed signal computing, including operating a mixed signal processor, is provided according to some embodiments. Process 10000 may be performed, for instance, by MSC 1000. In step 10010 operations are performed on data using analog and digital components; the analog and digital components are controlled 10020 with a programmed digital core in this embodiment. In some instances, process 10000 may optionally include programming 10030 the digital core. This may include programming the digital core to: (1) configure the analog components to perform analog operations on the data when minimizing power as a system design choice or when maximizing performance as a system design choice, and (2) utilize one or more digital elements when performing operations on the data when maximizing accuracy/precision as a system design choice.

Figure 11:
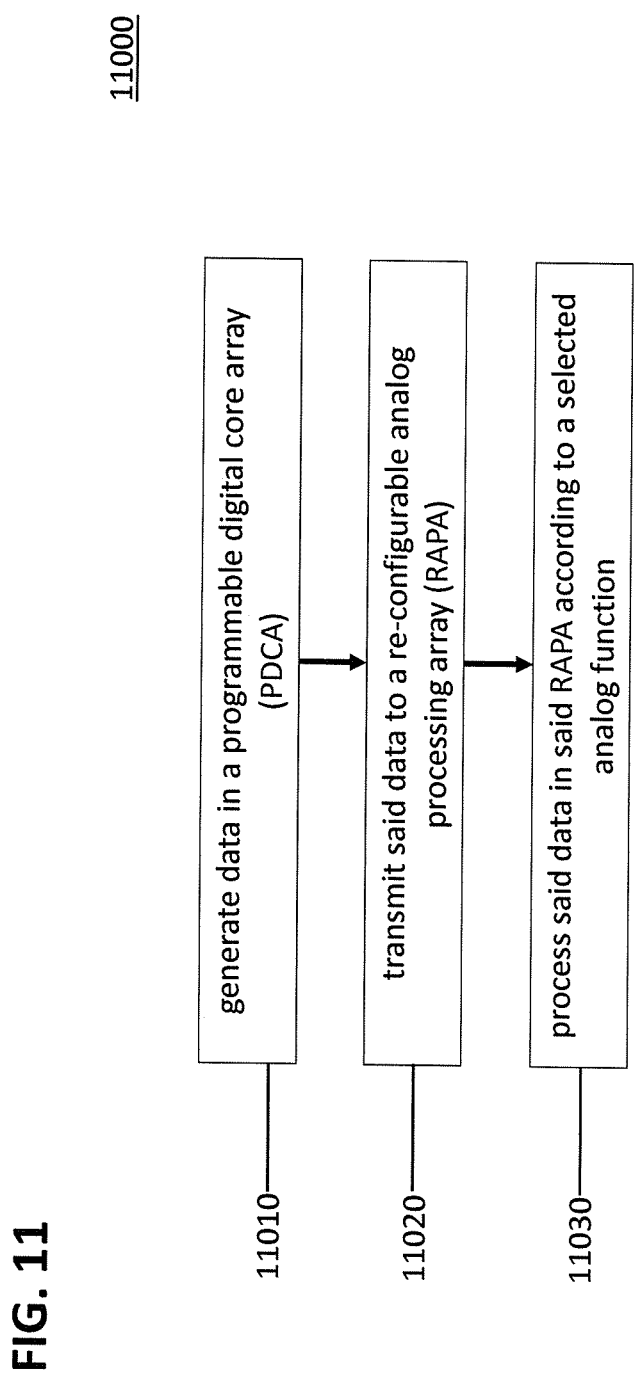
FIG. 11 is a flow chart of a method according to some embodiments.

Referring now to FIG. 11, a process 11000 for mixed signal computing including operating a mixed signal processor is provided according to some embodiments. Process 11000 may be performed, for instance, by MSC 1000. The process 11000 includes generating data in a programmable digital core array (PDCA) (step 11010); transmitting said data to a re-configurable analog processing array (RAPA) (step 11020); and processing said data in said RAPA according to a selected analog function (step 11030), wherein at least one core of PDCA is arranged to configure said RAPA to perform said selected analog function.

In some embodiments, said PDCA comprises: a first digital processing core and a second digital processing core, wherein said first digital processing core performs said configuring, and wherein said data is a synthetic digital waveform generated by said second digital processing core or is an external analog signal input as data.

In some embodiments, process 11000 further includes outputting data from said RAPA, wherein said data is generated according to said processing.

In some embodiments, process 11000 further includes performing one or more of a digital addition or digital multiplication process with said PDCA.

In some embodiments, process 11000 further includes any combination of the steps included in process 9000. In some embodiments, process 11000 further includes any combination of the step included in process 10000.

Figure 12:
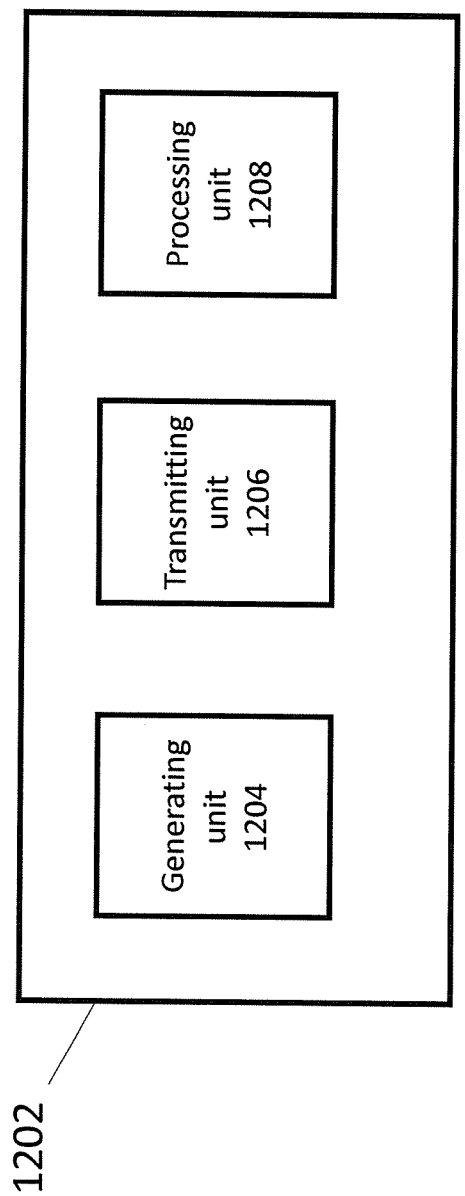
FIG. 12 is a diagram showing functional elements of a mixed signal computer according to some embodiments.

FIG. 12 is a diagram showing functional units of mixed signal computer 1202 according to some embodiments. As shown in FIG. 12, the mixed signal computer 1202 includes a generating unit 1204 for generating data in a programmable digital core array (PDCA); a transmitting unit 1206 for transmitting said data to a re-configurable analog processing array (RAPA); and a processing unit 1208 for processing said data in said RAPA according to a selected analog function, wherein at least one core of PDCA is arranged to configure said RAPA to perform said selected analog function.

In some embodiments, the mixed signal computer 1202 further includes an obtaining unit for obtaining a plurality of sequential samples of an analog signal at a periodic rate, such that there is a time period between each of said plurality of samples; another processing unit for processing a first of said plurality of sequential samples in the analog domain to generate an output; and a performing unit for performing a digital operation on a digital sample, wherein processing of said first sample is completed before a second sample of said plurality of sequential samples is obtained.

In some embodiments, the mixed signal computer 1202 further includes a performing unit for performing operations on said data using analog and digital components; and a controlling unit for controlling said analog and digital components with a programmed digital core.

Exemplary Embodiments

Aspects of the disclosure are summarized by the following numbered embodiments.

Embodiment 1. A signal converter, comprising:
a digital signal input;
an analog signal input;
a first plurality of signal outputs, wherein said first plurality of outputs are based on said digital input signal; and
a second plurality of signal outputs, wherein said second plurality of outputs are based on said analog input signal,
wherein said first plurality of outputs comprises a digital signal output, a sampled analog signal output, and a continuous analog signal output, and
wherein said second plurality of outputs comprises a continuous analog signal output, a digital signal output, and a sampled analog signal output.

Embodiment 2. The signal converter of embodiment 1,
wherein said converter is configured to output at least one of said first plurality of output signals in a floating point format and a fixed point format, and
wherein said converter is configured to output at least one of said second plurality of output signals in a floating point format and a fixed point format.

Embodiment 3. The signal converter of embodiment 2, further comprising:
an exponent and sign input,
wherein said converter is configured to output at least one of said first and second plurality of output signals in floating point format based on said exponent and sign input, and
wherein said output floating point format further comprises an analog mantissa.

Embodiment 4. The signal converter of any of embodiments 1-3, further comprising:
a digital to analog converter and a smoothing filter, wherein said first plurality of output signals are generated, at least in part, by processing said digital input signal using said digital to analog converter and said smoothing filter; and
a sample and hold unit and an analog to digital converter, wherein said second plurality of output signals are generated, at least in part, by processing said analogy input signal using said sample and hold unit and said analog to digital converter.

Embodiment 5. A mixed signal computer, comprising:
a first exchange register;
a second exchange register; and
an operational block,
wherein said first exchange register is coupled to the input of said operational block and said second exchange register is coupled to the output of said operational block, and
wherein said operational block is configured to perform both analog and digital operations.

Embodiment 6. The mixed signal computer of embodiment 5, wherein at least one of said first or second exchange register is a signal converter according to any of embodiments 1-4.

Embodiment 7. A mixed signal computer, comprising:
an analog array containing one or more analog components and one or more digital components, wherein said at least a portion of said analog components and said digital components are connectable to form a network arranged to perform at least one selected analog processing function on an analog signal supplied to said analog array; and a digital array containing a plurality of digital processing units, wherein a first portion of said digital array is used for configuring said network, and wherein a second portion of said digital array is used to type of said analog processing function to be performed by said analog array.

Embodiment 8. A mixed signal computer, comprising:

at least one digital core;

at least one digital register connectable to at least one of said digital cores;

one or more analog arrays containing configurable analog and digital components;

one or more registers connected an analog-to-digital converter and a digital-to-analog converter;

at least one analog register connect to at least one of said analog components; and one or more registers interconnected with at least one of said digital cores and at least one of said analog arrays.

Embodiment 9. The mixed signal computer of embodiment 23 further comprising:

one or more digital memories;

one or more analog memories; and associated data, address, and control buses and memory controller blocks.

Embodiment 10. The mixed signal computer of embodiment 8 or 9, wherein at least one of said digital cores is a digital core control unit.

Embodiment 11. The mixed signal computer of embodiment 10, wherein said digital core control unit is operable to configure the analog array and a plurality of said digital registers in said array, and wherein said digital core control unit controls said configuration of said analog network array based on instructions stored in one of said digital memories, and wherein said instructions for said digital core control unit load a plurality of registers to control said configuration of said analog array, wherein said registers are configured to perform one of the following activities: controlling and defining the network array configuration and functionality; storing digital and analog values; storing coefficient values; storing threshold values; storing control signal values; storing event timer circuity values; and storing interconnections between components and elements, and wherein at least a portion of said registers are memory-mapped in said memories.

Embodiment 12. A method for operating a mixed signal computer (or mixed signal computing), comprising:

performing operations on data using analog and digital components; and controlling said analog and digital components with a programmed digital core.

Embodiment 13. The method of embodiment 12, further comprising:

programming said digital core to:

configure said analog components to perform analog operations on said data when minimizing power as a system design choice or when maximizing performance as a system design choice, and utilize one or more digital elements when performing operations on said data when maximizing accuracy/precision as a system design choice.

While various embodiments of the present disclosure are described herein, it should be understood that they have been presented by way of example only, and not as a limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the functions described above and illustrated in the figures are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A mixed signal computer, comprising:

at least one re-configurable analog processing array (RAPA);

at least one programmable digital core array (PDCA); and one or more communication paths between said at least one RAPA and at least one PDCA, wherein said at least one RAPA includes a plurality of registers, the plurality of registers of said RAPA are addressable and memory mapped, and said mixed signal computer is configured such that each of said plurality of registers is read from or written to by one or more digital cores of said PDCA.

2. The mixed signal computer of claim 1, wherein said at least one RAPA includes one or more additional components including one or more of: fan-out blocks: integrators; multipliers; analog memories; digital memories; arithmetic units; adders; accumulators; digital to analog converters (DACs) and analog to digital converters (ADCs); analog inputs; analog outputs; banks of coefficient value registers; banks of threshold value registers; event timers registers; control registers; digital input registers; digital output registers; run control registers; and network or crossbar control registers organized into banks, and at least two of said additional components of each of said at least one RAPA are connected via a programmable network.

3. The mixed signal computer of claim 2, wherein said programmable network comprises (i) one or more crossbar networks and/or (ii) a memory-mapped bus.

4. The mixed signal computer of claim 1, wherein said one or more communication paths comprise one or more of address lines, data lines, or control lines.

5. A mixed signal computer, comprising:

at least one re-configurable analog processing array (RAPA);

at least one programmable digital core array (PDCA); and one or more communication paths between said at least one RAPA and at least one PDCA wherein said PDCA comprises a master core, and wherein said master core is arranged to configure one or more analog components or network connections of said RAPA based on instructions stored in a digital memory, and said master core is arranged to move one or more values from a PDCA memory into registers of said RAPA.

6. A mixed signal computer, comprising:

a re-configurable analog array comprising a plurality of analog components and a first plurality of digital components, wherein at least a portion of i) said plurality of analog components and ii) said first plurality of digital components is configurable to form a connected network arranged to perform at least one selected analog processing function on an analog signal supplied to said re-configurable analog array; and a re-configurable digital array comprising a second plurality of digital processing units, wherein the re-configurable digital array comprises a first portion and a second portion, the first portion of said re-configurable digital array is used for configuring said connected network, and the second portion of said re-configurable digital array is used to determine what type of said analog processing function is selected to be performed by said re-configurable analog array when formed in said connected network.

7. The mixed signal computer of claim 6, wherein said re-configurable digital array comprises digital processing cores and at least one digital register connectable to at least one of said digital processing cores, and said re-configurable analog array comprises: one or more registers connected to one or more exchange registers, at least one analog register connected to at least one of said analog components, and one or more registers interconnected with at least one of said at least one digital processing cores and at least one of said analog components.

8. The mixed signal computer of claim 7, wherein each of said one or more exchange registers comprises:

a digital signal input, an analog signal input, and a first plurality of signal outputs, wherein said first plurality of signal outputs are based on said digital input signal; and a second plurality of signal outputs, wherein said second plurality of signal outputs are based on said analog signal input, wherein said first plurality of signal outputs comprises a digital signal output, a sampled analog signal output, and a continuous analog signal output, and said second plurality of outputs comprises a continuous analog signal output, a digital signal output, and a sampled analog signal output.

9. The mixed signal computer of claim 8, wherein each of said one or more exchange registers is configured to output at least one of said first plurality of signal outputs in a floating point format or a fixed point format, and wherein said converter is configured to output at least one of said second plurality of signal outputs in a floating point format or a fixed point format.

10. The mixed signal computer of claim 9, wherein each of said one or more exchange registers is configured to accept an exponent and sign input as part of an analog signal input, said converter is configured to output at least one of said first and second plurality of output signals in floating point format based on said exponent and sign input, and wherein said output floating point format further comprises an analog mantissa.

11. The mixed signal computer of claim 9, wherein each of said one or more exchange registers further comprises:

a digital to analog converter and a smoothing filter, wherein said first plurality of signal outputs are generated, at least in part, by processing said digital signal input using said digital to analog converter and said smoothing filter; and a sample and hold unit and an analog to digital converter, wherein said second plurality of signal outputs are generated, at least in part, by processing said analogy signal input using said sample and hold unit and said analog to digital converter.

12. The mixed signal computer of claim 6, further comprising:

one or more digital memories;

one or more analog memories;

associated data address control buses; and memory controller blocks.

13. The mixed signal computer of claim 12, wherein at least one of said digital processing cores is a digital core control unit, and said digital core control unit is operable to configure the re-configurable analog array and a plurality of digital registers in said re-configurable analog array, wherein said digital core control unit is configured to control said configuration of said analog network array based on instructions stored in one of a plurality of associated digital memories of said re-configurable digital array, said instructions for said digital core control unit load a plurality of registers to control said configuration of said re-configurable analog array, said registers are configured to perform one of the following activities:

controlling and defining the network array configuration and functionality; storing digital and analog values; storing coefficient values; storing threshold values; storing control signal values;

storing event timer circuitry values; and storing interconnections between components and elements, and at least a portion of said registers are memory-mapped in said associated digital memories.

14. The mixed signal computer of claim 13, wherein said re-configurable digital array further comprises:

at least one auxiliary core arranged to generate digital value waveforms and provide said waveforms to one or more digital input registers, wherein said auxiliary core is arranged to preload values in one or more control registers from a memory in said digital array.

15. The mixed signal computer of claim 12, wherein said one or more digital memories comprise volatile and non-volatile memories.

16. A system, the system comprising:

an analog detector configured to output analog signals, one or more first processing elements configured to continuously perform mathematical operations on the signals outputted from the analog detector in response to instructions from a control unit, one or more second processing elements performing mathematical operations on the signals outputted from the analog detector in response to instructions from the control unit, one or more exchange registers performing signal conversion operations in response to instructions from a control unit, and control logic operatively connected to said one or more first processing elements and said one or more second processing elements, wherein the control logic is configured to control power delivered to said one or more first processing elements and said one or more second processing elements such that (i) the mathematical operations performed by said one or more first processing elements, (ii) the mathematical operations performed by said one or more second processing elements are performed in a particular sequence, and (iii) signal value conversions are performed in a particular sequence in order to process the analog signals outputted from the analog detector.

17. The system of claim 16, wherein each of said one or more first processing elements consumes less power as compared to each of said one or more second processing elements.

18. The system of claim 16, wherein said one or more first processing elements are analog processing elements and said one or more second processing elements are digital processing elements.

* * * * *